(12) United States Patent
Tsai et al.

(10) Patent No.: US 8,340,240 B2
(45) Date of Patent: Dec. 25, 2012

(54) SHIFT REGISTER OF LCD DEVICES

(75) Inventors: Tsung-Ting Tsai, Hsin-Chu (TW);
Ming-Sheng Lai, Hsin-Chu (TW);
Min-Feng Chiang, Hsin-Chu (TW);
Chun-Hsin Liu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/492,916

(22) Filed: Jun. 10, 2012

(65) Prior Publication Data

US 2012/0250816 A1 Oct. 4, 2012

Related U.S. Application Data

(62) Division of application No. 12/607,042, filed on Oct. 27, 2009, now Pat. No. 8,229,058.

(30) Foreign Application Priority Data

Apr. 8, 2009 (TW) .............................. 98111706 A

(51) Int. Cl.
*G11C 19/00* (2006.01)

(52) U.S. Cl. ................. 377/64; 377/69; 377/78; 377/79
(58) Field of Classification Search .......... None
See application file for complete search history.

(56) References Cited

U.S. PATENT DOCUMENTS

| | | | |
|---|---|---|---|
| 6,970,530 B1 | 11/2005 | Wang | |
| 7,310,402 B2 | 12/2007 | Wei | |
| 7,317,780 B2 | 1/2008 | Lin | |
| 7,342,568 B2 | 3/2008 | Wei | |
| 7,450,681 B2 | 11/2008 | Wei | |
| 7,843,421 B2 | 11/2010 | Chang | |
| 7,953,201 B2 * | 5/2011 | Tsai et al. | 377/64 |
| 2006/0284815 A1 | 12/2006 | Kwon | |
| 2007/0237285 A1 | 10/2007 | Chien | |
| 2009/0041177 A1 | 2/2009 | Chien | |
| 2009/0304138 A1 * | 12/2009 | Tsai et al. | 377/79 |
| 2011/0002437 A1 | 1/2011 | Su | |
| 2011/0007863 A1 | 1/2011 | Tsai | |

* cited by examiner

*Primary Examiner* — Tuan T Lam
(74) *Attorney, Agent, or Firm* — Winston Hsu; Scott Margo

(57) ABSTRACT

A shift register includes a plurality of shift register units coupled in series. Each shift register unit, receiving an input voltage at an input end and an output voltage at an output end, includes a node, a pull-up driving circuit, a pull-up circuit and first through third pull-down circuits. The pull-up driving circuit can transmit the input voltage to the node, and the pull-up circuit can provide the output voltage based on a high-frequency clock signal and the input signal. The first pull-down circuit can provide a bias voltage at the node or at the output end based on a first low-frequency clock signal. The second pull-down circuit can provide a bias voltage at the node or at the output end based on a second low-frequency clock signal. The third pull-down circuit can provide a bias voltage at the node or at the output end based on a feedback voltage.

5 Claims, 18 Drawing Sheets

SHIFT REGISTER OF LCD DEVICES

CROSS REFERENCE TO RELATED APPLICATIONS

This application is a division of U.S. application Ser. No. 12/607,042 filed Oct. 27, 2009, now U.S. Pat. No. 8,229,058 the entire contents of which are included herein by reference.

BACKGROUND OF THE INVENTION

1. Field of the Invention

The present invention is related to a shift register, and more particularly, to a shift register which drives pull-down circuits using low-frequency signals.

2. Description of the Prior Art

Liquid crystal display (LCD) devices, characterized in low radiation, small size and low power consumption, have gradually replaced traditional cathode ray tube (CRT) devices and been widely used in various electronic devices, such as notebook computers, personal digital assistants (PDAs), flat panel televisions or mobiles phones. Traditional LCD devices display images by driving the panel pixels using external driver chips. In order to reduce the number of devices and manufacturing costs, GOA (gate driver on array) technique has been developed in which the gate driver is directly manufactured on the LCD panel. A GOA gate driver usually functions in form of shift register, in which pull-up circuits provide a plurality of gate driving signals to the display panel and pull-down circuits stabilize output signals.

Referring to FIG. 1, which depicts a simplified functional diagram of a prior art LCD device 100. FIG. 1 only illustrates partial structure of the LCD device 100, including gate lines GL(1)-GL(N), a shift register 110, a clock generator 120 and a power supply 130. For operating the shift register 110, the clock generator 120 provides a start pulse signal VST and two high-frequency clock signals CH1 and CH2, while the power supply 130 provides bias voltages VDD and VSS. The shift register 110 includes a plurality of serially-coupled shift register units SR(1)-SR(N) having output ends coupled to corresponding gate lines GL(1)-GL(N), respectively. According to the high-frequency clock signals CH1, CH2 and the start pulse signal VST, the shift register 110 can sequentially output gate driving signals GS(1)-GS(N) to the corresponding gate lines GL(1)-GL(N) via the shift register units SR(1)-SR(N), respectively.

Referring to FIG. 2, which depicts a diagram of a shift register illustrated in U.S. Pat. No. 7,310,402 "GATE LINE DRIVERS FOR ACTIVE MATRIX DISPLAYS" (hereinafter as "prior art 1"). FIG. 2 illustrates a circuit diagram of an nth stage shift register unit SR(n) among the plurality of shift register units SR(1)-SR(N) in prior art 1 (n is an integer between 1 and N). The shift register unit SR(n) includes an input end IN(n), an output end OUT(n), a first pull-down circuit 16, a second pull-down circuit 26, a maintain circuit 36, a pull-up driving circuit 46, and a pull-up circuit 56. The input end IN(n) of the shift register unit SR(n) is coupled to the output end OUT(n−1) of the prior-stage shift register unit SR(n−1), while the output end OUT(n) of the shift register unit SR(n) is coupled to the input end IN(n+1) of the next-stage shift register unit SR(n+1). In prior art 1, the pull-up operation is performed by transistor switches T1 and T2, wherein the transistor switch T1 controls the signal transmission path between the input end IN(n) and the node Q(n) according to the gate driving signal GS(n−1), and the transistor switch T2 controls the signal transmission path between the clock signal CH1 and the output end OUT(n) according to the voltage level of the node Q(n). Meanwhile, the pull-down operation is performed by the first pull-down circuit 16 and the second pull-down circuit 26. In the first pull-down circuit 16, the serially-coupled transistor switches T3 and T4 respectively receive the high-frequency clock signals CH1 and CH2 having opposite phases at their respective gates, thereby generating control signals to the gates of the transistor switches T5 and T6. Therefore, the transistor switch T5 can control the signal transmission path between the node Q(n) and the voltage VSS according to its gate voltage, and the transistor switch T6 can control the signal transmission path between the output end OUT(n) and the voltage VSS according to its gate voltage. In the second pull-down circuit 26, the serially-coupled transistor switches T7 and T8 respectively receive the high-frequency clock signals CH2 and CH1 having opposite phases at their respective gates, thereby generating control signals to the gates of the transistor switches T9 and T10. Therefore, the transistor switch T9 can control the signal transmission path between the node Q(n) and the voltage VSS according to its gate voltage, and the transistor switch T10 can control the signal transmission path between the output end OUT(n) and the voltage VSS according to its gate voltage. The maintain circuit 36 maintains the gate voltages of the transistor switches T5, T6, T9 and T10 using the transistor switches T11-T13.

Referring to FIG. 3, which depicts a diagram of a shift register illustrated in U.S. Pat. No. 7,342,568 "SHIFT REGISTER CIRCUIT" (hereinafter as "prior art 2"). FIG. 3 illustrates a circuit diagram of an nth stage shift register unit SR(n) among the plurality of shift register units SR(1)-SR(N) in prior art 2 (n is an integer between 1 and N). The shift register unit SR(n) includes an input end IN(n), an output end OUT(n), a first pull-down circuit 18, a second pull-down circuit 28, a third pull-down circuit 38, a pull-up driving circuit 48, and a pull-up circuit 58. The input end IN(n) of the shift register unit SR(n) is coupled to the output end OUT(n−1) of the prior-stage shift register unit SR(n−1), while the output end OUT(n) of the shift register unit SR(n) is coupled to the input end IN(n+1) of the next-stage shift register unit SR(n+1). In prior art 2, the pull-up operation is performed by transistor switches T1 and T2, wherein the transistor switch T1 controls the signal transmission path between the input end IN(n) and the node Q(n) according to the gate driving signal GS(n−1), and the transistor switch T2 controls the signal transmission path between the clock signal CH1 and the output end OUT(n) according to the voltage level of the node Q(n). Meanwhile, the main pull-down operation is performed by the first pull-down circuit 18 and the second pull-down circuit 28. In the first pull-down circuit 18, the serially-coupled transistor switches T3 and T4 respectively receive the high-frequency clock signals CH1 and CH2 having opposite phases at their respective gates, thereby generating control signals to the gates of the transistor switches T5 and T6. Therefore, the transistor switch T5 can control the signal transmission path between the node Q(n) and the voltage VSS according to its gate voltage, and the transistor switch T6 can control the signal transmission path between the output end OUT(n) and the voltage VSS according to its gate voltage. In the second pull-down circuit 28, the serially-coupled transistor switches T7 and T8 respectively receive the high-frequency clock signals CH2 and CH1 having opposite phases at their respective gates, thereby generating control signals to the gates of the transistor switches T9 and T10. Therefore, the transistor switch T9 can control the signal transmission path between the node Q(n) and the voltage VSS according to its gate voltage, and the transistor switch T10 can control the signal transmission path between the output end OUT(n) and the voltage VSS according to its gate voltage.

Referring to FIG. 4, which depicts a timing diagram illustrating the operation of the prior art shift register. When driving the LCD devices in prior art 1 and prior art 2, the clock signals CH1 and CH2 switch between a high voltage level Vgh and a low voltage level Vgl based on a duty cycle of 50%, and have opposite phases at the same time. The 1st stage shift register unit SR(1) generates the 1st stage gate driving signal GS(1) according to the start pulse signal VST, while the 2nd-Nth stage shift register units SR(2)-SR(N) generate the 2nd-Nth stage gate driving signals GS(2)-GS(N) according to the output signals generated by their respective prior-stage shift register units. In other words, the gate driving signals GS(2)-GS(N) can be viewed as the start pulse signals which respectively enable the shift register units SR(2)-SR(N). The prior art shift register performs the pull-up operation between t1 and t3, and performs the pull-down operation after t3. For the nth stage shift register unit SR(n), the period between t1 and t2 is the driving period of its prior-stage shift register unit SR(n−1), during which the clock signal CH1 is at low voltage level, while the clock signal CH2 and the gate driving signal GS(n−1) are at high voltage level. The transistor switch T1 is thus turned on, thereby pulling up the node Q(n) to the high voltage level VDD. Meanwhile, the transistor switch T2 is also turned on, and the gate driving signal GS(n) is pulled down to the low voltage level Vgl due to the feed-through effect of the transistor switches in the pixels. At t2, the clock signal CH1 switches from low voltage level to high voltage level, thereby providing the gate driving signal GS(n) having high voltage level between t2 and t3 (when the clock signal CH1 is at high voltage level) via the turned-on transistor switch T2. On the other hand, the pull-down circuits 16, 26 and 18, 28 operate in a complimentary manner and each handles 50% of the pull-down operation. The gate driving signal GS(n) can thus be maintained at low voltage level VSS during the time excluding the driving period of the nth stage shift register unit SR(n). When the clock signal CH1 is at low voltage level, the clock signal CH2 is at high voltage level, the input signal of the shift register unit SR(n) (the gate driving signal GS(n−1)) is at low voltage level, and the output signal of the shift register unit SR(n) (the gate driving signal GS(n)) is at low voltage level, the gates of the transistor switches T5 and T6 are substantially kept at the low voltage level VSS, while the gates of the transistor switches T9 and T10 are substantially kept at the high voltage level VDD. Similarly, when the clock signal CH1 is at high voltage level, the clock signal CH2 is at low voltage level, and the output signal of the shift register unit SR(n) (the gate driving signal GS(n)) is at low voltage level, the gates of the transistor switches T5 and T6 are substantially kept at the high voltage level VDD, while the gates of the transistor switches T9 and T10 are substantially kept at the low voltage level VSS. Therefore, in the prior art shift register, the gates of the transistor switches T5, T6, T9 and T10 are kept at high voltage level for about 50% of a period, while at low voltage level for about 50% of the period.

With increasing demand for panel resolution, the charge time of the pixels is shortened. The clock signals CH1 and CH2 need to have higher frequencies, and power consumption also increases accordingly. In the prior art LCD devices, the high-frequency clock signals CH1 and CH2 are used for driving the pull-down circuits. In addition to high power consumption, the pull-down operation might eventually fail as the characteristics of the transistor switches deviate with time. Meanwhile, due to the feed-through effect, the gate driving signal GS(n) is discharged to the low voltage level Vgl which is lower than the ideal level VSS before its driving period, thereby causing charge coupling to the data voltages of the pixels and influencing the display quality of the LCD device.

SUMMARY OF THE INVENTION

The present invention provides a shift register comprising a plurality of serially-coupled shift register units, an Nth stage shift register unit among the plurality of shift register units comprising an input end for receiving an input voltage; an output end for outputting an output voltage; a first node; a pull-up driving circuit for transmitting the input voltage to the first node; a pull-up circuit for providing the output voltage according to a first clock signal and the input voltage; a first pull-down circuit for providing a first voltage at the first node or at the output end according to a second clock signal; a second pull-down circuit for providing a second voltage at the first node or at the output end according to a third clock signal, wherein a frequency of the first clock signal is higher than a frequency of the second or the third clock signal; and a third pull-down circuit for providing a third voltage at the first node or at the output end according to a feedback voltage.

The present invention further provides a shift register comprising a plurality of serially-coupled shift register units, an Nth stage shift register unit among the plurality of shift register units comprising an input end for receiving an input voltage; an output end for outputting an output voltage; a node; a pull-up driving circuit for transmitting the input voltage to the node; a pull-up circuit for providing the output voltage according to a first clock signal and the input voltage so that the output voltage is at a first voltage level during a driving period of the Nth stage shift register unit, wherein the first clock signal switches between the first voltage level and a second voltage level with a predetermined frequency and the first voltage level is higher than the second voltage level; a pull-down circuit for maintaining the output voltage at a third voltage level during a period excluding the driving period of the Nth stage shift register unit, wherein the third voltage level is higher than the second voltage level; and a fast pull-down circuit for maintaining a voltage level of the node or the output end according to a feedback voltage so that the output voltage is at the second voltage level during a driving period of an (N+1)th stage shift register unit among the plurality of the shift register units.

The present invention further provides a shift register comprising a plurality of serially-coupled shift register units, an Nth stage shift register unit among the plurality of shift register units comprising an input end for receiving an input voltage; an output end for outputting an output voltage; a node; a pull-up driving circuit for transmitting the input voltage to the node; a pull-up circuit for providing the output voltage according to a first clock signal and the input voltage so that the output voltage is at a second voltage level during a driving period of an (N−1)th stage shift register unit, at a first voltage level during a driving period of the Nth stage shift register unit, and at the second voltage level during a driving period of an (N+1)th stage shift register unit, wherein the first clock signal switches between the first and second voltage levels with a predetermined frequency and the first voltage level is higher than the second voltage level; and a pull-down circuit for maintaining the output voltage at a third voltage level during a period excluding the driving period of the Nth stage shift register unit, wherein the third voltage level is higher than the second voltage level.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
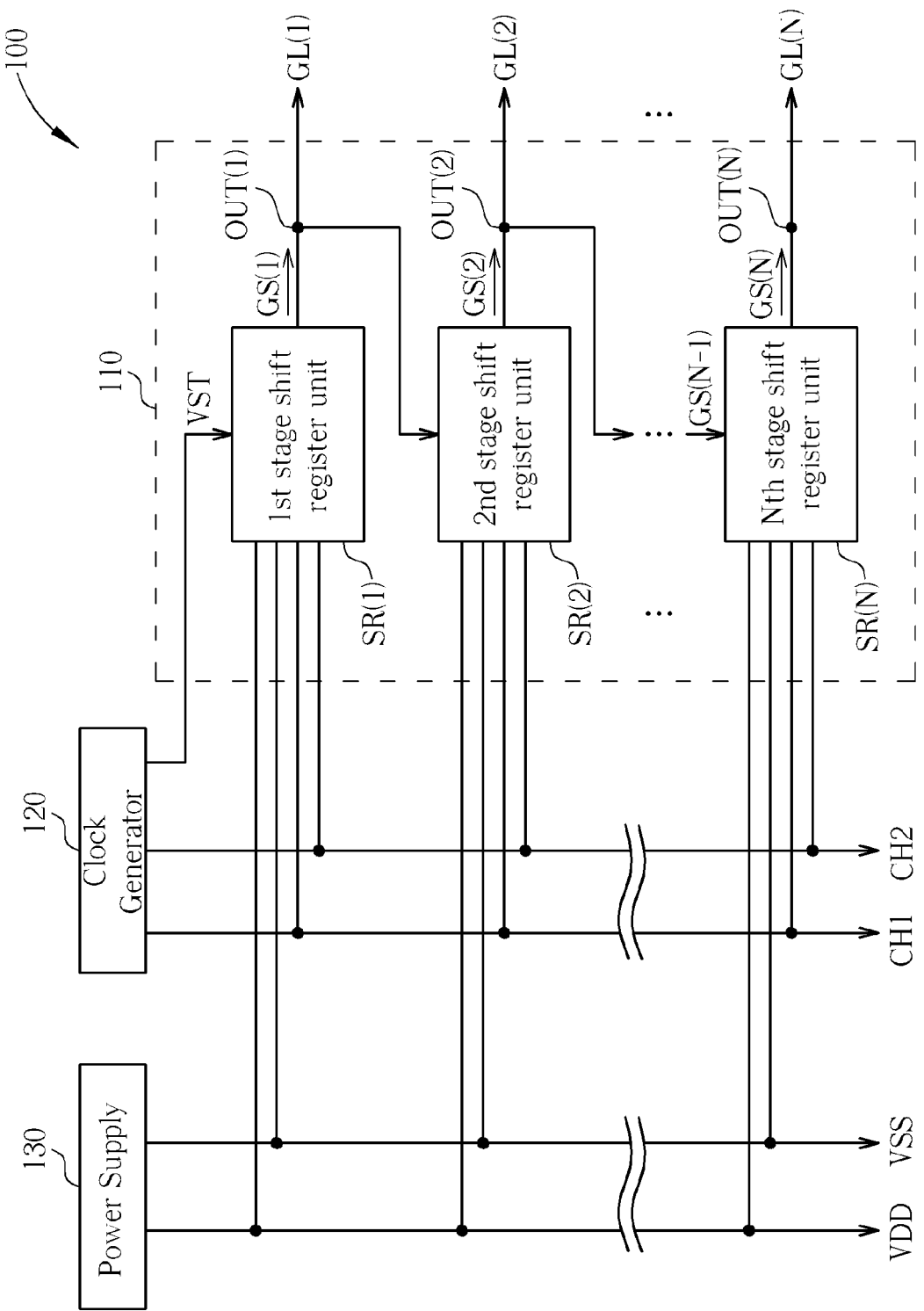
FIG. 1 is a simplified functional diagram of a prior art LCD device.
Figure 2:
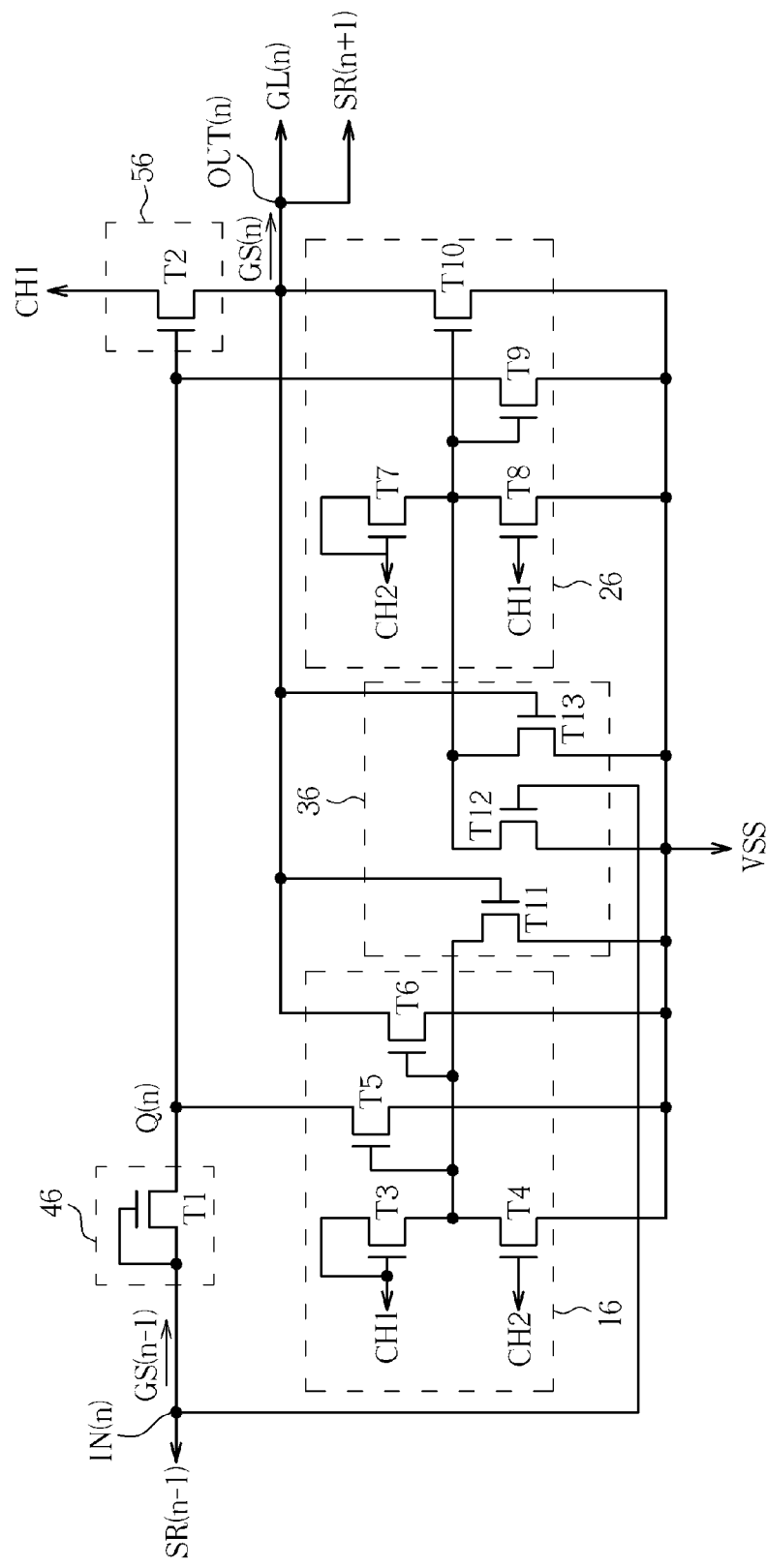
FIGS. 2 and 3 are diagrams illustrating prior art shift registers.
Figure 3:
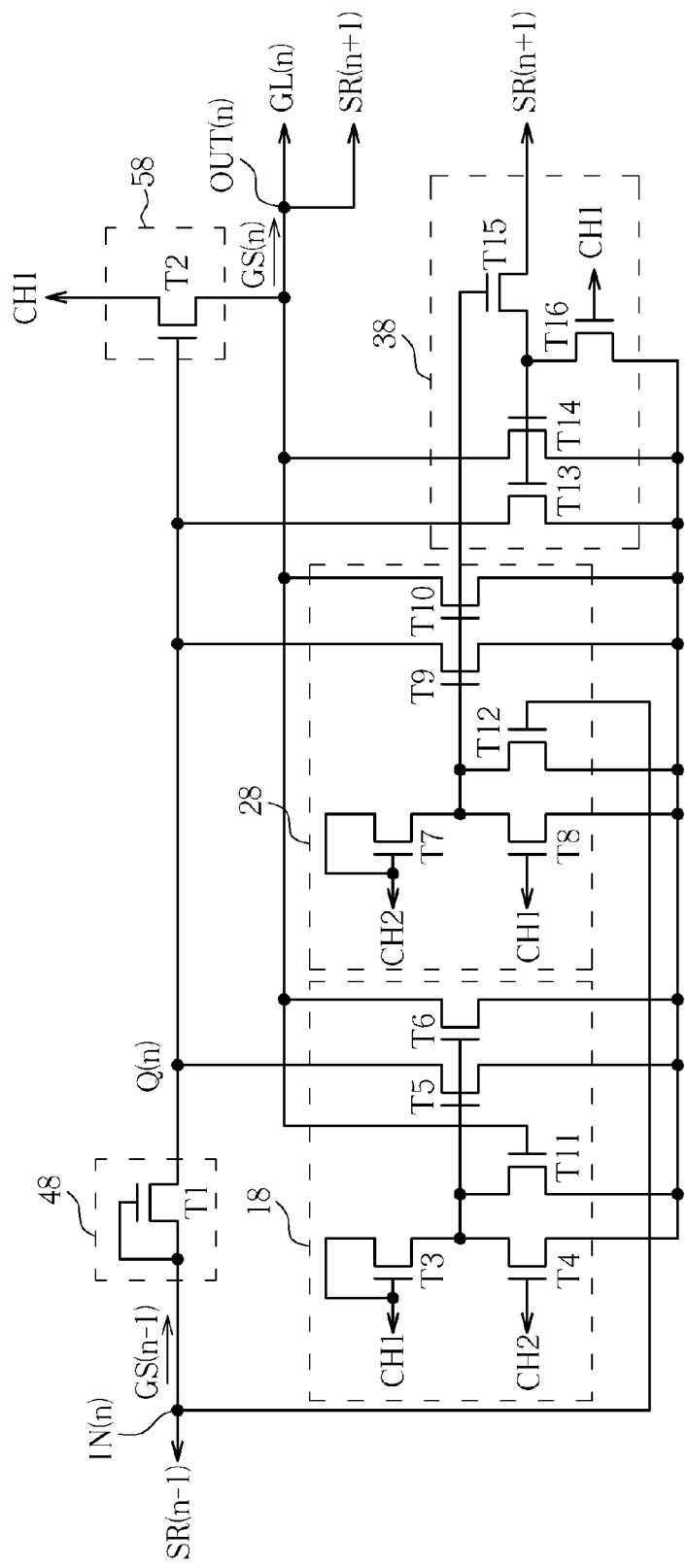
Figure 4:
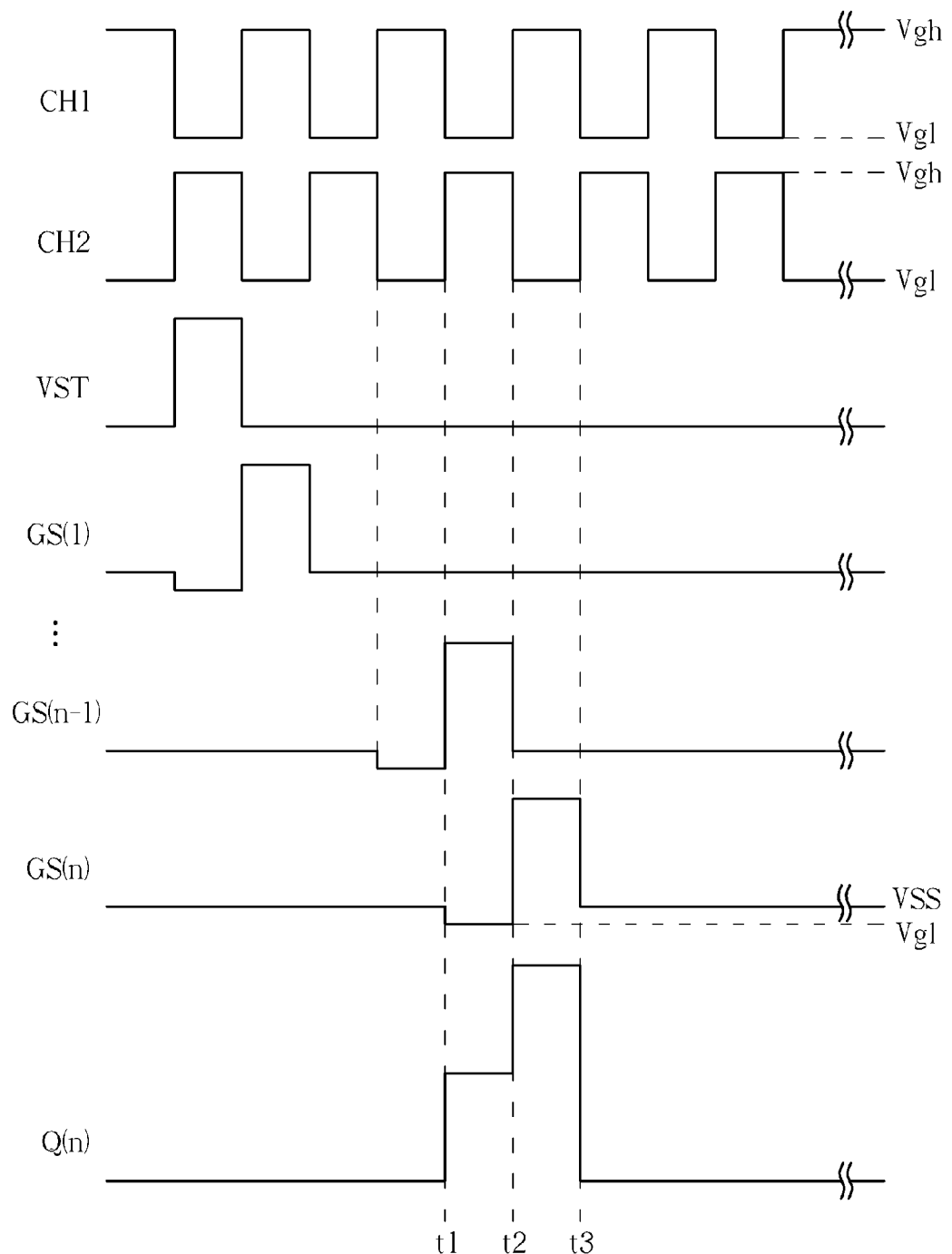
FIG. 4 is a timing diagram illustrating the operation of the prior art shift registers.
Figure 5:
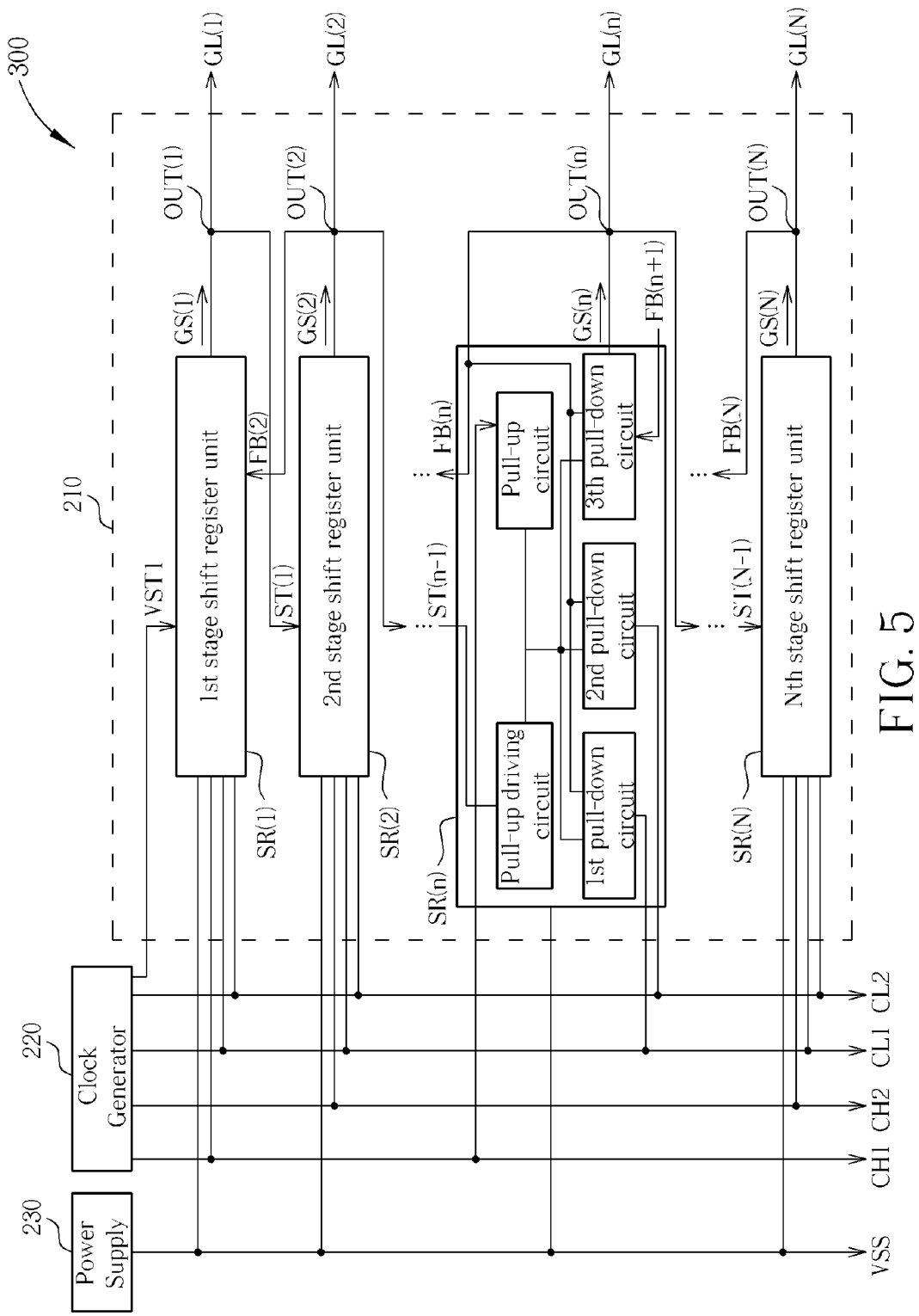
FIGS. 5 and 6 are simplified functional diagrams of an LCD device according to the present invention.
Figure 6:
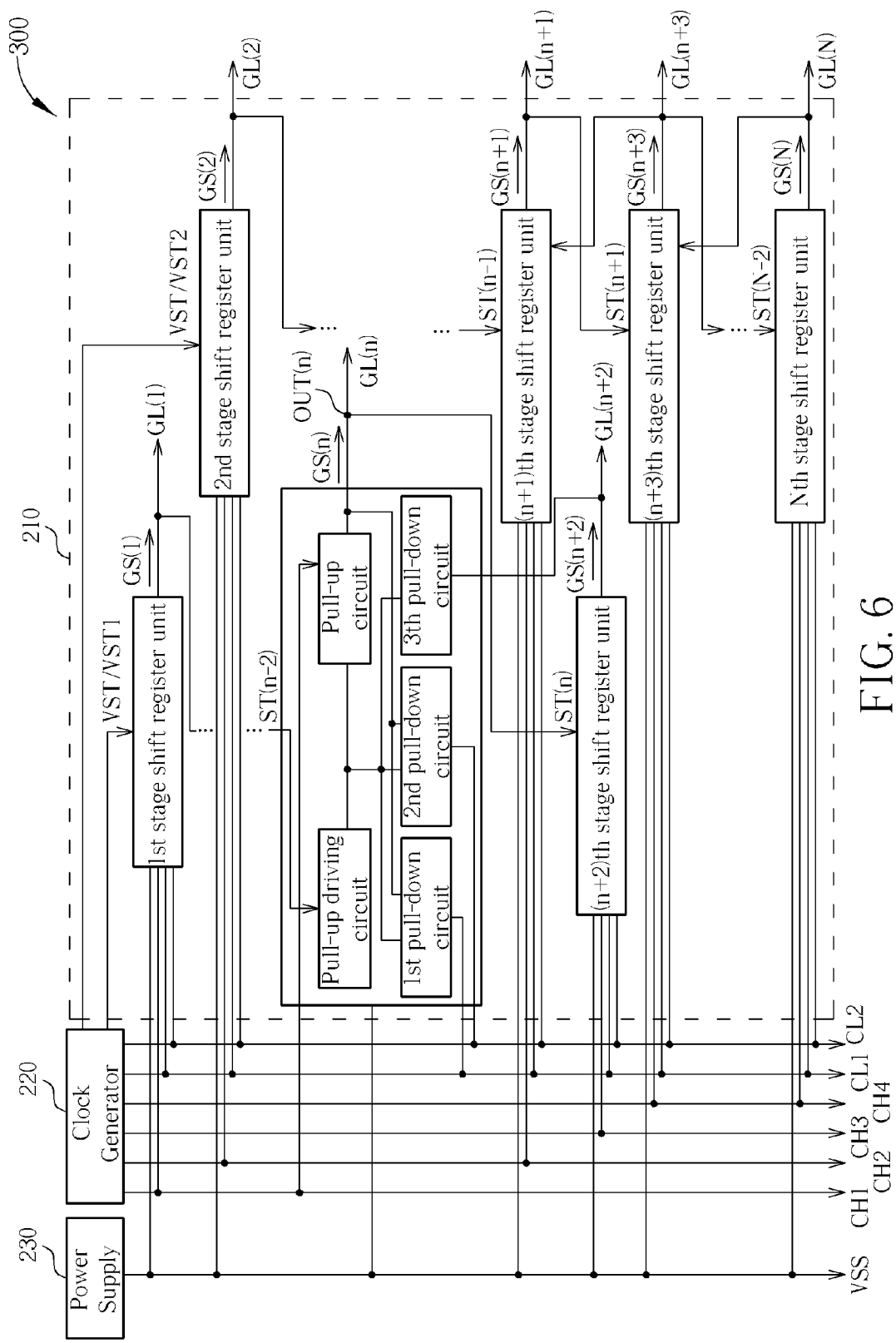

Referring to FIGS. 5 and 6, which depict simplified functional diagrams of an LCD device 300 according to the present invention, including gate lines GL(1)-GL(N), a shift register 210, a clock generator 220 and a power supply 230. For operating the shift register 210, the clock generator 220 provides start pulse signals VST/VST1/VST2, a plurality of high-frequency clock signals CH1-CHM, and two low-frequency clock signals CL1 and CL2, while the power supply 230 provides a bias voltage VSS. The shift register 210 includes a plurality of serially-coupled shift register units SR(1)-SR(N). According to corresponding high-frequency clock signals CH1-CHM, corresponding input signals ST(1)-ST(N−1) and corresponding feedback signals FB(1)-FB(N), the shift register units SR(1)-SR(N) can sequentially output gate driving signals GS(1)-GS(N) to the corresponding gate lines GL(1)-GL(N) at respective output ends OUT(1)-OUT(N). For the 1st stage shift register unit SR(1), the input signal ST(1) is the start pulse signal VST, VST1 or VST2 provided by the clock generator 220, and the received feedback signal FB(2) is the gate driving signal GS(2) generated by the 2nd stage shift register unit SR(2). For an nth stage shift register unit SR(n) among the shift register units SR(2)-SR(N), its input end IN(n) is coupled to a prior-stage shift register unit SR(n−m) and its output end OUT(n) is coupled to the input end of a next-stage shift register unit SR(n+m). Therefore, the input signal ST(n−m) is provided by the shift register SR(n−m), and the feedback signal FB(n+m) is the gate driving signal GS(n+m) provided by the shift register SR(n+m), wherein each of (n+m) and (n+m) is a positive integer smaller than N, and the value of M is equal to $2^m$.

FIG. 5 depicts a simplified functional diagram of the LCD device 300 according to the present invention when m=1, while FIG. 6 depicts a simplified functional diagram of the LCD device 300 according to the present invention when m=2. In the embodiment illustrated in FIG. 5 (m=1), the 1st stage shift register unit SR(1) generates the 1st stage gate driving signal GS(1) according to the start pulse signal VST1, while an nth stage shift register unit SR(n) among the shift register units SR(2)-SR(N) generates the nth stage gate driving signal GS(n) according to the input signal ST(n−1) generated by the shift register unit SR(n−1) and the feedback signal FB(n+1) generated by the shift register unit SR(n+1). In the embodiment illustrated in FIG. 6 (m=2), the 1st stage shift register unit SR(1) generates the 1st stage gate driving signal GS(1) according to the start pulse signal VST or VST1, the 2nd stage shift register unit SR(2) generates the 2nd stage gate driving signal GS(2) according to the start pulse signal VST or VST2, and an nth stage shift register unit SR(n) among the shift register units SR(3)-SR(N) generates the nth stage gate driving signal GS(n) according to the output signal generated by the shift register unit SR(n−2) and the feedback signal generated by the shift register unit SR(n+2).

FIGS. 5 and 6 only illustrate detailed functional diagrams of the nth stage shift register unit SR(n) and other shift register units have identical structure. The shift register unit SR(n) includes a first pull-down circuit, a second pull-down circuit, a third pull-down circuit, a pull-up driving circuit and a pull-up circuit. The input end of the shift register unit SR(n) is coupled to a prior-stage shift register unit SR(n−m), while the output end OUT(n) of the shift register unit SR(n) is coupled to a next-stage shift register unit SR(n+m). The first pull-down circuit operates according to the low-frequency clock signal CL1, the second pull-down circuit operates according to the low-frequency clock signal CL2, the third pull-down circuit operates according to the gate driving signal GS(n+m) generated by the shift register unit SR(n+m), the pull-up driving circuit operates according to the signal transmitted from the shift register unit SR(n−m), and the pull-up circuit operates according to a corresponding high-frequency clock signal among the high-frequency clock signals CH1-CHM. For example, the pull-up circuits of the nth-(n+3)th shift register units SR(n)-SR(n+3) operate according to the high-frequency clock signals CH1-CH4, respectively.

Figure 7:
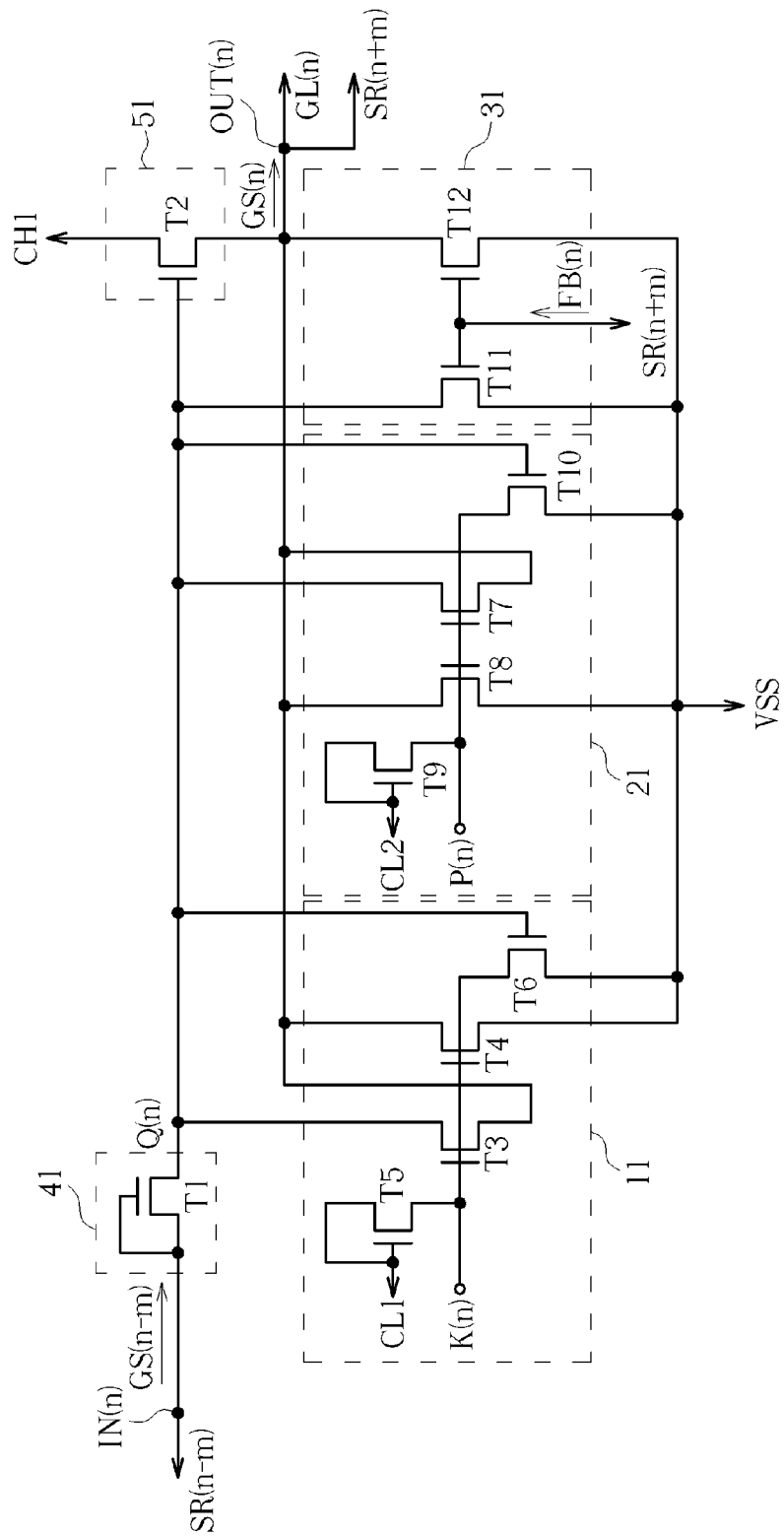
FIG. 7 is a diagram of an nth stage shift register unit according to a first embodiment of the present invention.

Referring to FIG. 7, which depicts a diagram of the nth stage shift register unit SR(n) according to a first embodiment of the present invention. In the first embodiment of the present invention, the shift register unit SR(n) includes an input end IN(n), an output end OUT(n), a first pull-down circuit 11, a second pull-down circuit 21, a third pull-down circuit 31, a pull-up driving circuit 41 and a pull-up circuit 51. The pull-up driving circuit 41 includes a transistor switch T1 having a gate and a drain coupled to the input end IN(n) for receiving the gate driving signal GS(n−m) from the shift register SR(n−m) and a source coupled to the node Q(n), thereby capable of controlling the signal transmission path between the input end IN(n) and the node Q(n) according the gate driving signal GS(n−m). The pull-up circuit 51 includes a transistor switch T2 having a gate coupled to the node Q(n), a drain coupled to the clock generator 220 for receiving a high-frequency clock signal among the high-frequency clock signals CH1-CHM (such as CH1) and a source coupled to the output end OUT(n), thereby capable of controlling the signal transmission path between the high-frequency clock signal CH1 and the output end OUT(n) according the voltage level of the node Q(n).

The first pull-down circuit 11 includes transistor switches T3-T6. The transistor switch T3 includes a gate coupled to the node K(n), a drain coupled to the node Q(n) and a source coupled to the output end OUT(n). The transistor switch T4 includes a gate coupled to the node K(n), a drain coupled to the output end OUT(n) and a source coupled to a voltage source VSS which provides a negative bias voltage. The transistor switch T5 includes a gate and a drain coupled to the clock generator 220 for receiving the low-frequency signal CL1 and a source coupled to the node K(n). The transistor switch T6 includes a gate coupled to the node Q(n), a drain coupled to the node K(n) and a source coupled to the voltage source VSS. The transistor switch T5 in the first pull-down circuit 11 controls the voltage level of the node K(n) according to the low-frequency signal CL1. When the node K(n) is at high voltage level, the node Q(n) is electrically connected to the output end OUT(n) via the turned-on transistor switch T3, and the output end OUT(n) is then electrically connected to the voltage source VSS via the turned-on transistor switch T4.

The second pull-down circuit 21 includes transistor switches T7-T10. The transistor switch T7 includes a gate coupled to the node P(n), a drain coupled to the node Q(n) and a source coupled to the output end OUT(n). The transistor switch T8 includes a gate coupled to the node P(n), a drain coupled to the output end OUT(n) and a source coupled to the voltage source VSS. The transistor switch T9 includes a gate and a drain coupled to the clock generator 220 for receiving the low-frequency signal CL2 and a source coupled to the node P(n). The transistor switch T10 includes a gate coupled to the node Q(n), a drain coupled to the node P(n) and a source coupled to the voltage source VSS. The transistor switch T9 in the second pull-down circuit 21 controls the voltage level of the node P(n) according to the low-frequency signal CL2. When the node P(n) is at high voltage level, the node Q(n) is electrically connected to the output end OUT(n) via the turned-on transistor switch T7, and the output end OUT(n) is then electrically connected to the voltage source VSS via the turned-on transistor switch T8.

The third pull-down circuit 31 includes transistor switches T11 and T12. The transistor switch T11 includes a gate coupled to the shift register unit SR(n+m) for receiving the feedback signal FB(n), a drain coupled to the node Q(n), and a source coupled to the voltage source VSS. The transistor switch T12 includes a gate coupled to the shift register unit SR(n+m) for receiving the feedback signal FB(n), a drain coupled to the output end OUT(n), and a source coupled to the voltage source VSS. The feedback signal FB(n) received by the third pull-down circuit 31 is the gate driving signal GS(n+m) generated by the shift register unit SR(n+m). When the gate driving signal GS(n+m) is at high voltage level, both the output end OUT(n) of the shift register unit SR(n) and the node Q(n) is pulled down to low voltage level. When m=1, the feedback signal FB(n) is the gate driving signal GS(n+1) generated by the shift register unit SR(n+1); when m=2, the feedback signal FB(n) is the gate driving signal GS(n+2) generated by the shift register unit SR(n+2), etc.

The transistor switch T10 includes a gate coupled to the node Q(n), a drain coupled to the node P(n) and a source coupled to the voltage source VSS. The transistor switch T9 in the second pull-down circuit 21 controls the voltage level of the node P(n) according to the low-frequency signal CL2. When the node P(n) is at high voltage level, the node Q(n) is electrically connected to the output end OUT(n) via the turned-on transistor switch T7, and the output end OUT(n) is thus electrically connected to the voltage source VSS via the turned-on transistor switch T8.

Figure 8:
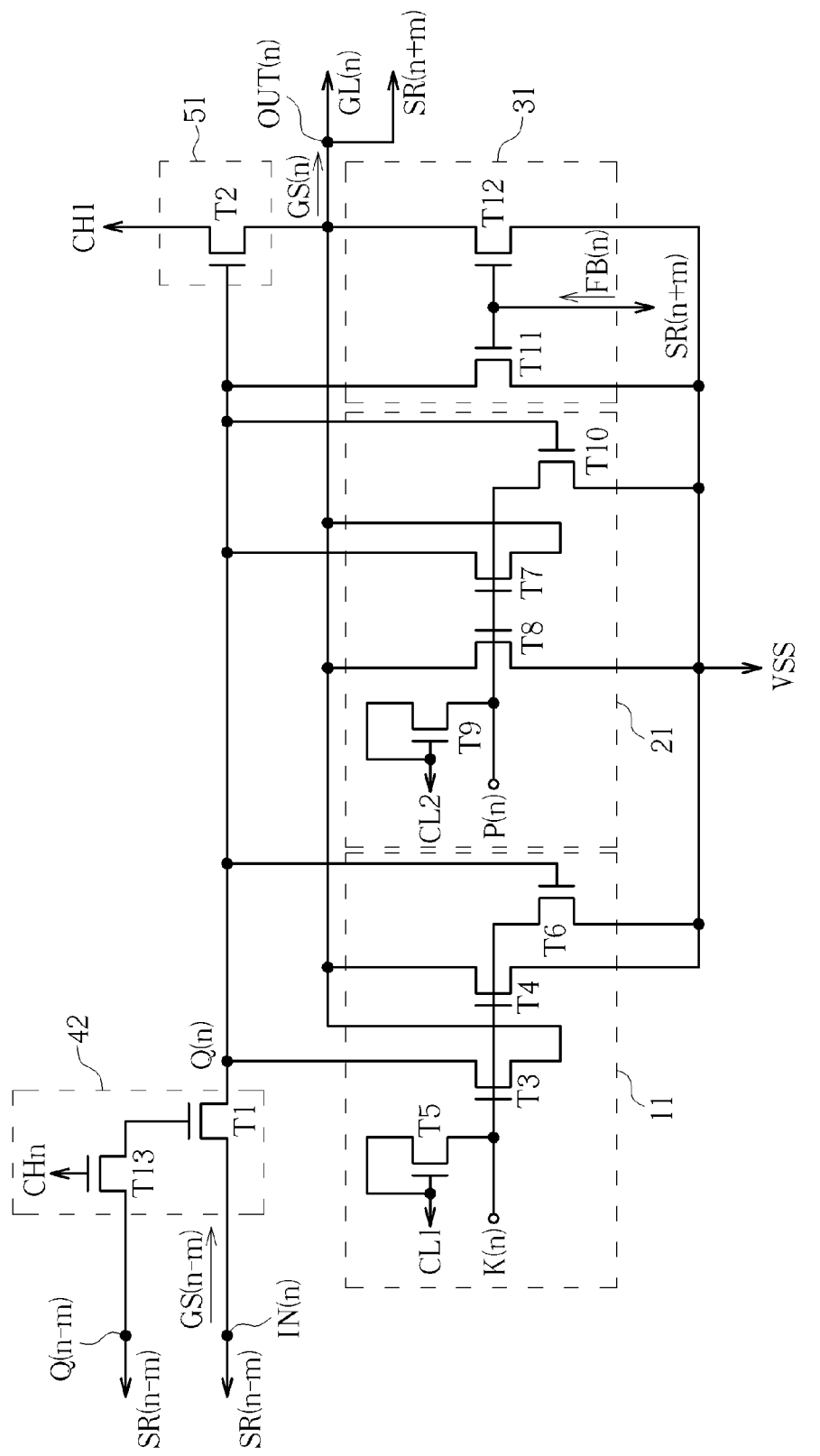
FIG. 8 is a diagram of an nth stage shift register unit according to a second embodiment of the present invention.

Referring to FIG. 8, which depicts a diagram of the nth stage shift register unit SR(n) according to a second embodiment of the present invention. In the second embodiment of the present invention, the shift register unit SR(n) includes an input end IN(n), an output end OUT(n), a first pull-down circuit 11, a second pull-down circuit 21, a third pull-down circuit 31, a pull-up driving circuit 42 and a pull-up circuit 51. Having similar structure as the first embodiment, the second embodiment of the present invention differs in that the pull-up driving circuit 42 includes transistor switches T1 and T13. The transistor switch T1 includes a gate coupled to the drain of the transistor switch T13, a drain coupled to the input end IN(n) for receiving the gate driving signal GS(n−m), and a source coupled to the node Q(n). The transistor switch T13 includes a gate coupled to the clock generator 220 for receiving the high-frequency clock signal CHn used by the shift register unit SR(n−m), and a source coupled to the node Q(n−m) of the shift register unit SR(n−m). The transistor switch T13 can maintain the gate voltage of the transistor switch T1, thereby reducing the leakage of the transistor switch T1. When m=1, the gate of the transistor switch T13 is coupled to the clock generator 220 for receiving the high-frequency clock signal used by the shift register unit SR(n−2) (such as CH4), and the source of the transistor switch T13 is coupled to the node Q(n−1) of the shift register unit SR(n−1); when m=2, the gate of the transistor switch T13 is coupled to the clock generator 220 for receiving the high-frequency clock signal used by the shift register unit SR(n−2) (such as CH3), and the source of the transistor switch T13 is coupled to the node Q(n−2) of the shift register unit SR(n−2), etc.

Figure 9:
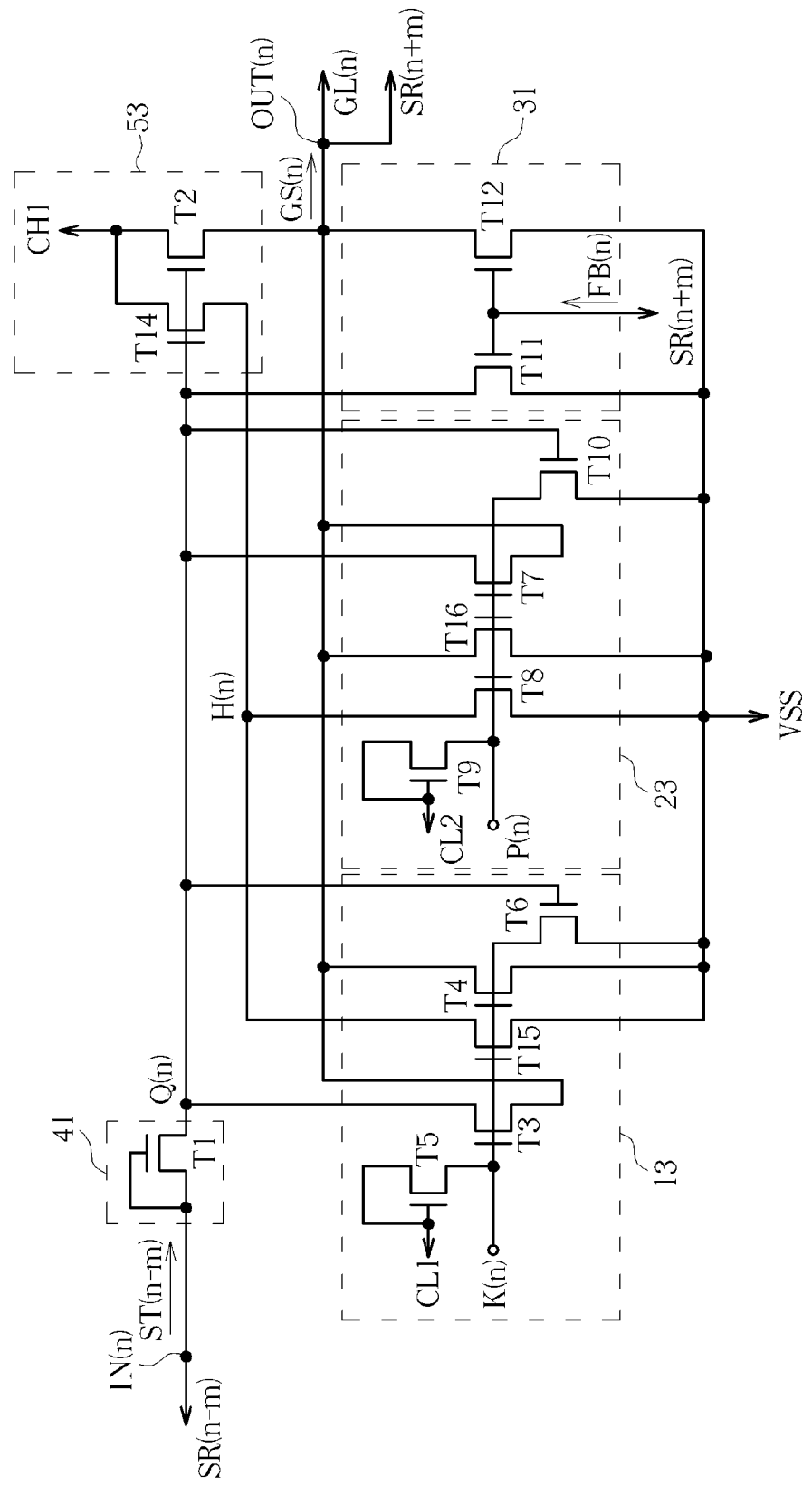
FIG. 9 is a diagram of an nth stage shift register unit according to a third embodiment of the present invention.

Referring to FIG. 9, which depicts a diagram of the nth stage shift register unit SR(n) according to a third embodiment of the present invention. In the third embodiment of the present invention, the shift register unit SR(n) includes an input end IN(n), an output end OUT(n), a first pull-down circuit 13, a second pull-down circuit 23, a third pull-down circuit 31, a pull-up driving circuit 41 and a pull-up circuit 53. The first and third embodiments of the present invention have similar structure, but differ in the structures of the first pull-down circuit 13, the second pull-down circuit 23, and the pull-up circuit 53. In the third embodiment of the present invention, the pull-up circuit 53 includes transistor switches T2 and T14. The transistor switch T2 includes a gate coupled to the node Q(n), a drain coupled to the clock generator 220 for receiving one of the high-frequency clock signals CH1-CHM (such as CH1), and a source coupled to the output end OUT(n), thereby capable of controlling the signal transmission path between the clock signal CH1 and the output end OUT(n) according to the voltage level of the node Q(n). The transistor switch T14, functioning as a carrier buffer, includes a gate coupled to the node Q(n), a drain coupled to the clock generator 220 for receiving one of the high-frequency clock signals CH1-CHM (such as CH1), and a source coupled to the node H(n), thereby capable of controlling the signal transmission path between the clock signal CH1 and the node H(n) according to the voltage level of the node Q(n). In the first embodiment of the present invention, the same gate driving signal GS(n) is transmitted to the gate line GL(n) and the shift register unit SR(n+m). However in the third embodiment of the present invention, the transistor switch T14 further generates the input signal ST(n+m) corresponding to the gate driving signal GS(n). Then, the gate driving signal GS(n) and the input signal ST(n+m) are transmitted to the gate line GL(n) and the shift register unit SR(n+m), respectively. In other words, the pull-up driving circuit 41 according to the third embodiment of the present invention operates according to the signal ST(n−m) generated at the node H(n−m) of the shift register unit SR(n−m). Meanwhile, the first pull-down circuit 13 further includes a transistor switch T15 and the second pull-down circuit 23 further includes a transistor switch T16, thereby capable of maintaining the voltage level of the node H(n) according the voltage levels of the nodes K(n) and P(n).

Figure 10:
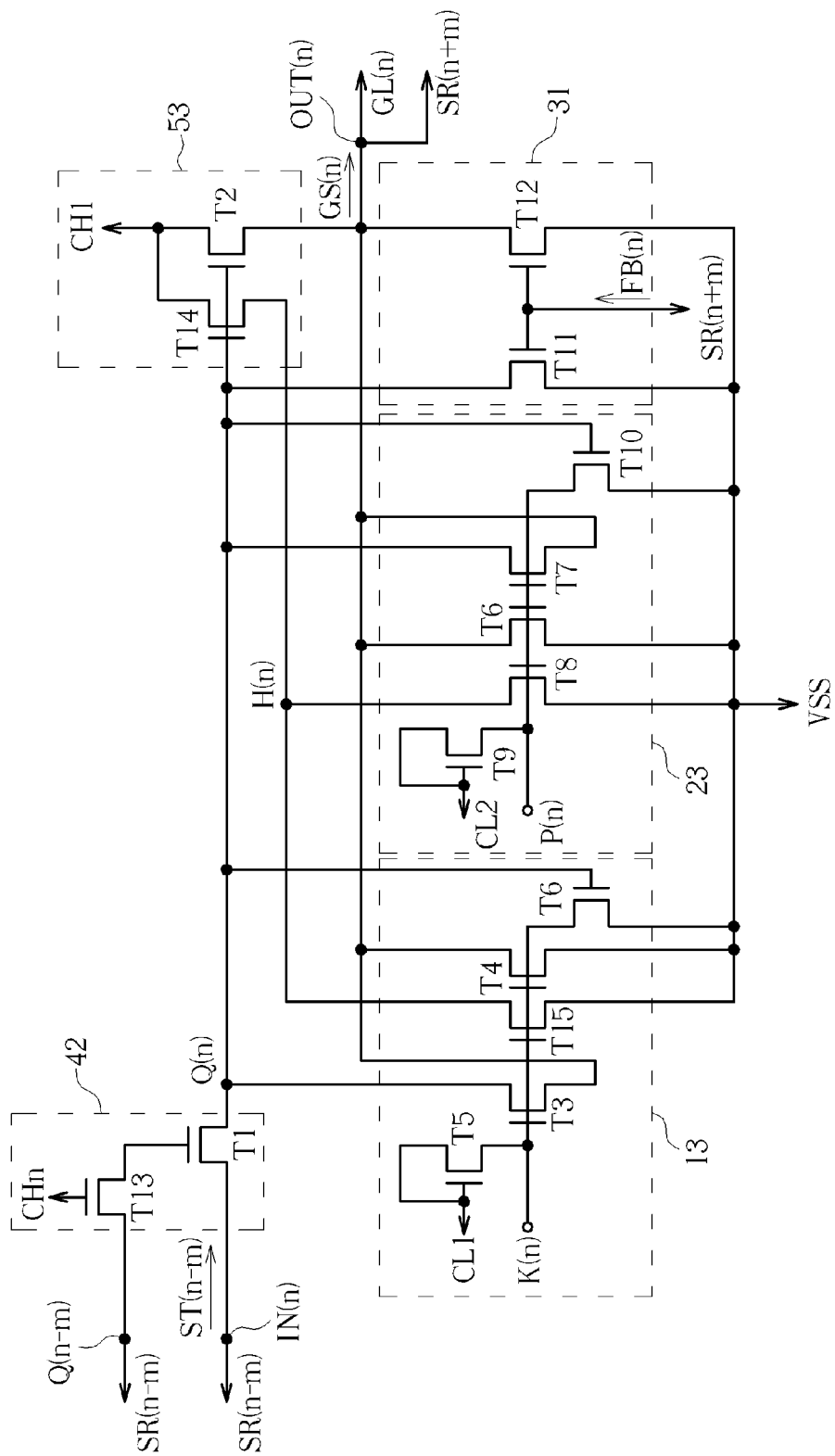
FIG. 10 is a diagram of an nth stage shift register unit according to a fourth embodiment of the present invention.

Referring to FIG. 10, which depicts a diagram of the nth stage shift register unit SR(n) according to a fourth embodiment of the present invention. In the fourth embodiment of the present invention, the shift register unit SR(n) includes an input end IN(n), an output end OUT(n), a first pull-down circuit 13, a second pull-down circuit 23, a third pull-down circuit 31, a pull-up driving circuit 42 and a pull-up circuit 53. The third and fourth embodiments of the present invention have similar structure, but the pull-up driving circuit 42 in the fourth embodiment includes transistor switches T1 and T13. The transistor switch T1 includes a gate coupled to the drain of the transistor switch T13, a drain coupled to the input end IN(n) for receiving the signal ST(n−m), and a source coupled to the node Q(n), thereby capable of operating according to the signal ST(n−m) generated at the node H(n−m) of the shift register unit SR(n−m). The transistor switch T13 includes a gate coupled to the clock generator 220 for receiving the high-frequency clock signal CHn used by the shift register unit SR(n−m), and a source coupled to the node Q(n−m) of the shift register unit SR(n−m). The transistor switch T13 can maintain the gate voltage of the transistor switch T1, thereby reducing the leakage of the transistor switch T1. When m=1, the gate of the transistor switch T13 is coupled to the clock generator 220 for receiving the high-frequency clock signal used by the shift register unit SR(n−1) (such as CH4), and the source of the transistor switch T13 is coupled to the node Q(n−1) of the shift register unit SR(n−1); when m=2, the gate of the transistor switch T13 is coupled to the clock generator 220 for receiving the high-frequency clock signal used by the shift register unit SR(n−2) (such as CH3), and the source of the transistor switch T13 is coupled to the node Q(n−2) of the shift register unit SR(n−2), etc.

Figure 11:
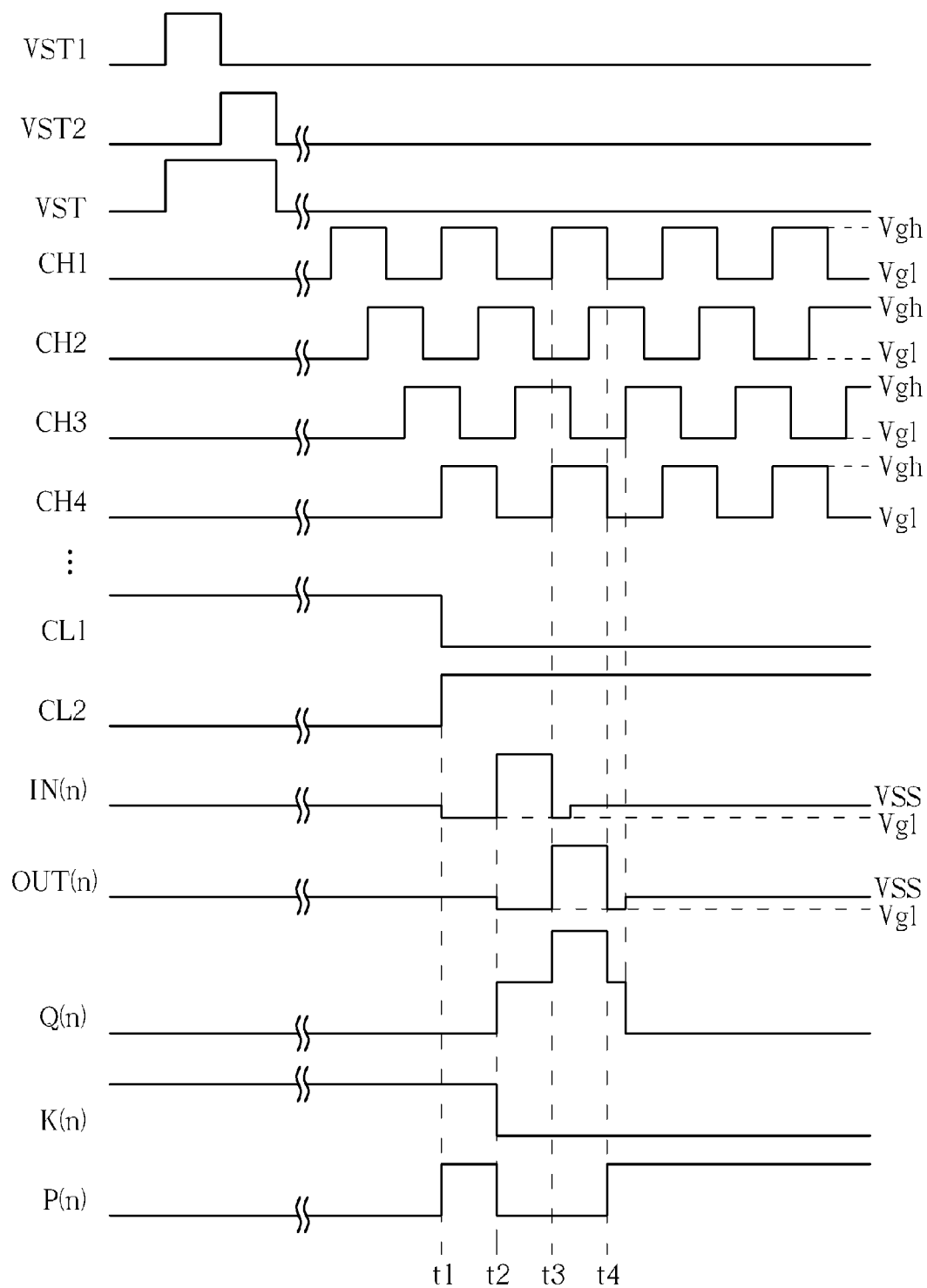
FIG. 11 is a timing diagram illustrating the operation of the shift register according to the first through fourth embodiments of the present invention.

Referring to FIG. 11, which depicts a timing diagram illustrating the operation of the shift register 300 according to the first through fourth embodiments of the present invention. In the embodiment illustrated in FIG. 5, the low-frequency clock signals CL1, CL2, the high-frequency clock signals CH1, CH2, and the start pulse signal VST are used for driving the shift register 210. In the embodiment illustrated in FIG. 6, the low-frequency clock signals CL1, CL2, the high-frequency clock signals CH1-CH4, and the start pulse signal VST, VST1 or VST2 are used for driving the shift register 210. The shift register units SR(1) and SR(2) can both be enabled by the start pulse signal VST, or by the start pulse signals VST1 and VST2, respectively. The pulse width of the high-frequency clock signals CH1-CH4 is equal to that of the start pulse signals VST1 and VST2, but the high-frequency clock signals CH1-CH4 differ in phase. The pulse width of the start pulse signal VST is twice as large as that of the start pulse signal VST1 or VST2. Each clock signal switches between a high voltage level Vgh and a low voltage level Vgl based on a predetermined frequency, wherein the frequency of the low-frequency clock signals CL1 and CL2 is much lower than that of the high-frequency clock signals CH1-CH4 (for example, the pulse width of the low-frequency clock signals CL1 and CL2 can be around 100 times as large as that of the start pulse signal VST1 or VST2, or the low-frequency clock signals CL1 and CL2 can switch phases every 100 frames when the high-frequency clock signals CH1-CH4 switch phases after each frame), and the low-frequency clock signals CL1 and CL2 have opposite phases at the same time. OUT(n), Q(n), K(n) and P(n) respectively represent the waveforms of the signals at the output end OUT(n) of the nth stage shift register unit SR(n), the node Q(n), the node K(n) and the node P(n), and will be explained in detail in the following paragraphs.

The high-frequency clock signal CH1, two low-frequency clock signal CL1, CL2, and the start pulse signal VST are used for driving the shift register unit SR(n) in the first through fourth embodiments of the present invention. The low-frequency clock signals CL1 and CL2 have opposite phases: when the low-frequency clock signal CL1 is at high voltage level, the main pull-down operation is performed by the first pull-down circuit 11 or 13; when the low-frequency clock signal CL2 is at high voltage level, the main pull-down operation is performed by the second pull-down circuit 21 or 23. For the nth stage shift register unit SR(n), the low-frequency clock signal CL1 remains at high voltage level and the low-frequency clock signal CL2 remains at low voltage level before t1, during which the first pull-down circuit 11 or 13 carries out the pull-down operation. At t1, the low-frequency clock signal CL1 switches from high voltage level to low voltage level and the low-frequency clock signal CL2 switches from low voltage level to high voltage level. With the node P(n) being pulled up to high voltage level via the turned-on transistor switch T9, the transistor switches T7 and T8 are then turned on, thereby maintaining the node Q(n) and the output end OUT(n) at low voltage level. The main pull-down operation is thus performed by the second pull-down circuit 21 or 23 during this period in which the transistor switch T5 is turned off but the node K(n) is still kept at high voltage level. Therefore, a part of the pull-down operation is still carried out by the first pull-down circuit 11 or 13. At t2, the input signal IN(n), which is the gate driving signal GS(n−m) in the first trough fourth embodiments of the present invention, switches from low voltage level to high voltage level, thereby pulling up the node Q(n) to high voltage level and then turning on the transistor switches T2, T6 and T10. Therefore, the node K(n) is pulled down to low voltage level via the turned-on transistor switch T6, the node P(n) is pulled down to low voltage level via the turned-on transistor switch T10, and the gate driving signal GS(n) is pulled down to the low voltage level Vgl due to the feed-through effect of the transistor switches in the pixels. At t3, the nth stage shift register SR(n) begins to perform the pull-up operation. The high-frequency signal CH1 switches from low voltage level to high voltage level, and is transmitted to the output end OUT(n) via the turned-on transistor switch T2, thereby providing the gate driving signal GS(n) to the gate line GL(n) and the shift register unit SR(n+m). At t4, the nth stage shift register SR(n) completes the pull-up operation and the high-frequency signal CH1 switches from high voltage level to low voltage level. With the output end OUT(n) being pulled up to low voltage level, the transistor switches T7 and T8 are again turned on and the second pull-down circuit 21 resumes performing the pull-down operation, thereby maintaining the node Q(n) and the output end OUT(n) at low voltage level. At this time, the voltage levels of the nodes K(n) and P(n) are determined by the low-frequency clock signals CL1 and CL2, respectively. In the first through fourth embodiments of the present invention, the lifetime and accuracy of the transistor switches can be increased by driving the shift register with a plurality of high-frequency clock signals and two low-frequency clock signals.

Figure 12:
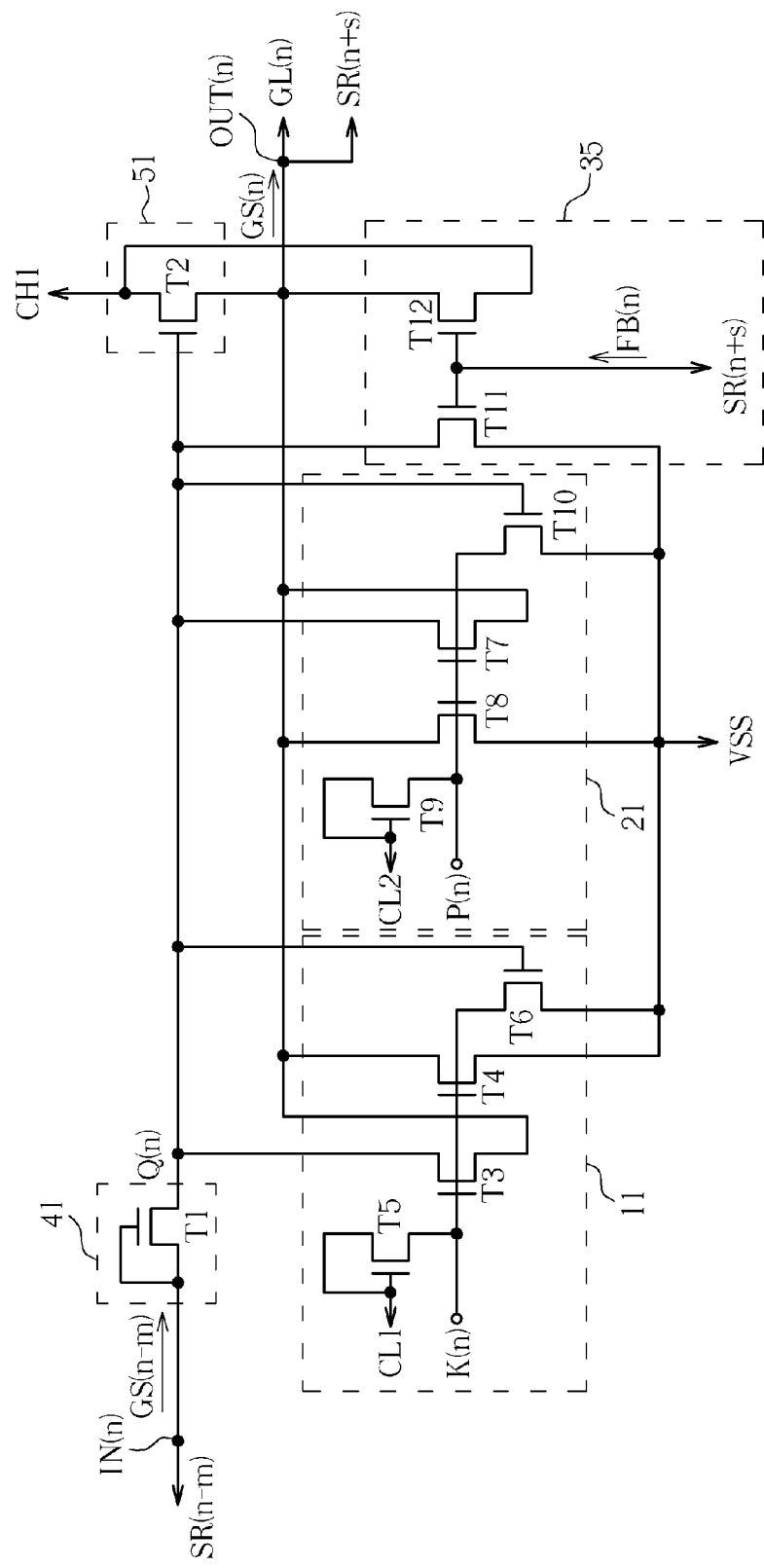
FIG. 12 is a diagram of an nth stage shift register unit according to a fifth embodiment of the present invention.

Referring to FIG. 12, which depicts a diagram of the nth stage shift register unit SR(n) according to a fifth embodiment of the present invention. In the fifth embodiment of the present invention, the shift register unit SR(n) includes an input end IN(n), an output end OUT(n), a first pull-down circuit 11, a second pull-down circuit 21, a fast pull-down circuit 35, a pull-up driving circuit 41 and a pull-up circuit 51. Having similar structure as the first embodiment, the fifth embodiment of the present invention further includes the fast pull-down circuit 35. The fast pull-down circuit 35 in the fifth embodiment of the present invention includes transistor switches T11 and T12. The transistor switch T11 includes a gate coupled to the output end OUT(n+s) of the shift register unit SR(n+s) for receiving the feedback signal FB(n), a drain coupled to the node Q(n), and a source coupled to the voltage source VSS. The transistor switch T12 includes a gate coupled to the gate of the transistor switch T11, a drain coupled to the drain of the transistor switch T2, and a source coupled to the source of the transistor switch T2. The operation of the LCD device 300 according to the fifth embodiment of the present invention will be explained in detail in the following paragraphs.

Figure 13:
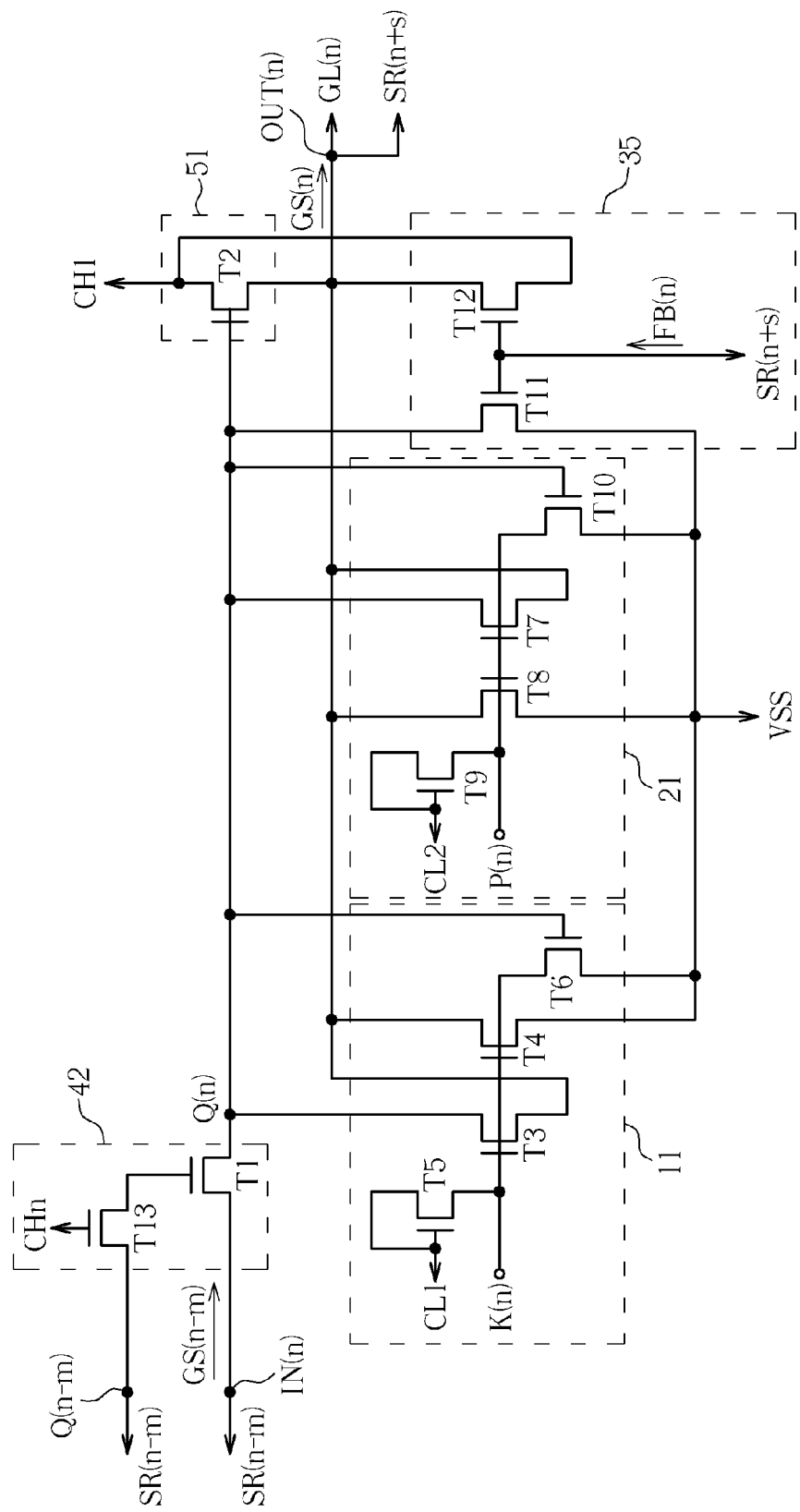
FIG. 13 is a diagram of an nth stage shift register unit according to a sixth embodiment of the present invention.

Referring to FIG. 13, which depicts a diagram of the nth stage shift register unit SR(n) according to a sixth embodiment of the present invention. In the sixth embodiment of the present invention, the shift register unit SR(n) includes an input end IN(n), an output end OUT(n), a first pull-down circuit 11, a second pull-down circuit 21, a fast pull-down circuit 35, a pull-up driving circuit 42 and a pull-up circuit 51. Having similar structure as the second embodiment, the sixth embodiment of the present invention further includes the fast pull-down circuit 35. The fast pull-down circuit in the sixth embodiment of the present invention includes transistor switches T11 and T12. The transistor switch T11 includes a gate coupled to the output end OUT(n+s) of the shift register unit SR(n+s) for receiving the feedback signal FB(n), a drain coupled to the node Q(n), and a source coupled to the voltage source VSS. The transistor switch T12 includes a gate coupled to the gate of the transistor switch T11, a drain coupled to the drain of the transistor switch T2, and a source coupled to the source of the transistor switch T2. The operation of the LCD device 300 according to the sixth embodiment of the present invention will be explained in detail in the following paragraphs.

Figure 14:
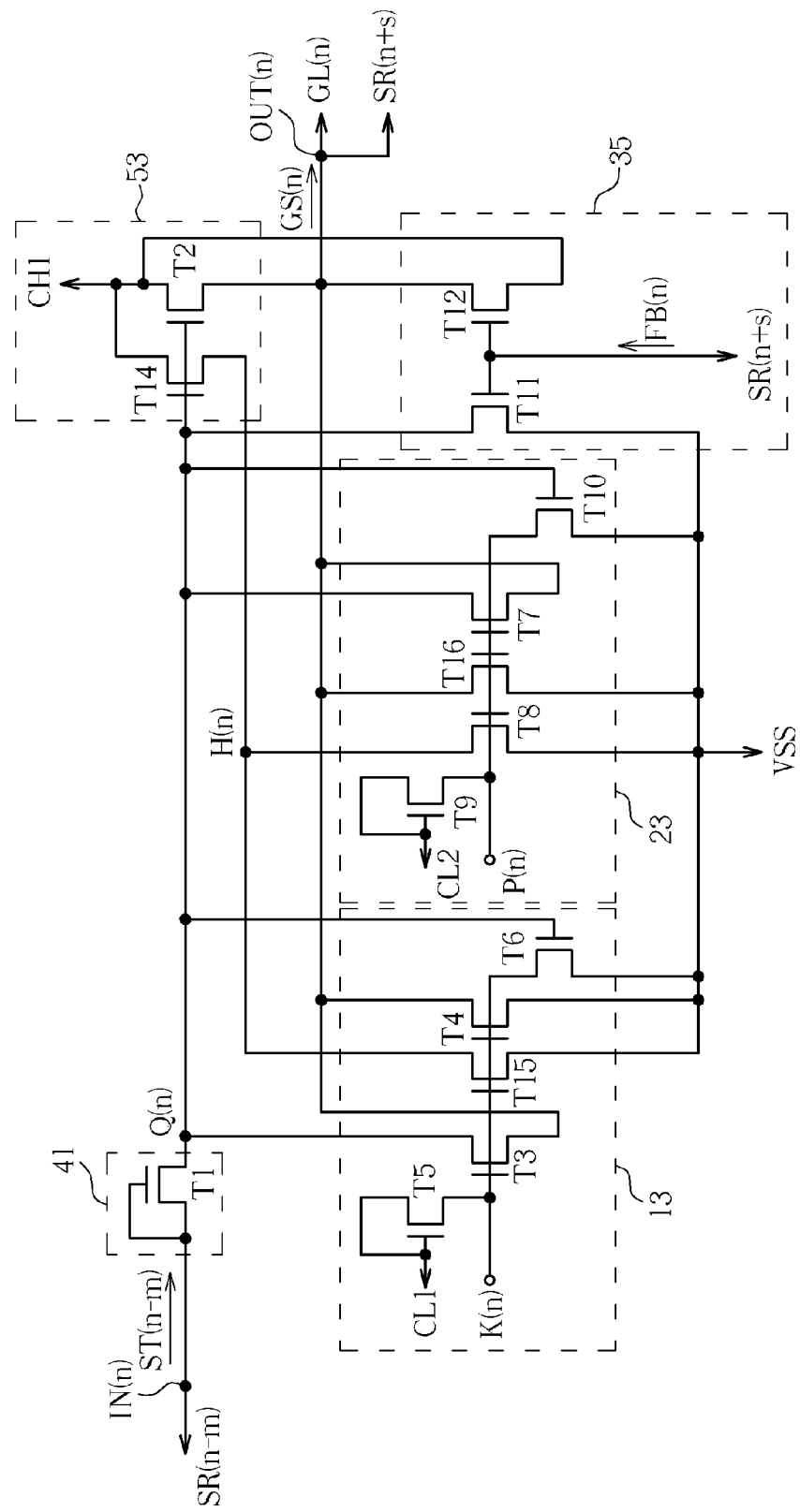
FIG. 14 is a diagram of an nth stage shift register unit according to a seventh embodiment of the present invention.

Referring to FIG. 14, which depicts a diagram of the nth stage shift register unit SR(n) according to a seventh embodiment of the present invention. In the seventh embodiment of the present invention, the shift register unit SR(n) includes an input end IN(n), an output end OUT(n), a first pull-down circuit 13, a second pull-down circuit 23, a fast pull-down circuit 35, a pull-up driving circuit 41 and a pull-up circuit 53. Having similar structure as the third embodiment, the seventh embodiment of the present invention further includes the fast pull-down circuit 35. The fast pull-down circuit 35 in the seventh embodiment of the present invention includes transistor switches T11 and T12. The transistor switch T11 includes a gate coupled to the output end OUT(n+s) of the shift register unit SR(n+s) for receiving the feedback signal FB(n), a drain coupled to the node Q(n), and a source coupled to the voltage source VSS. The transistor switch T12 includes a gate coupled to the gate of the transistor switch T11, a drain coupled to the drain of the transistor switch T2, and a source coupled to the source of the transistor switch T2. The operation of the LCD device 300 according to the seventh embodiment of the present invention will be explained in detail in the following paragraphs.

Figure 15:
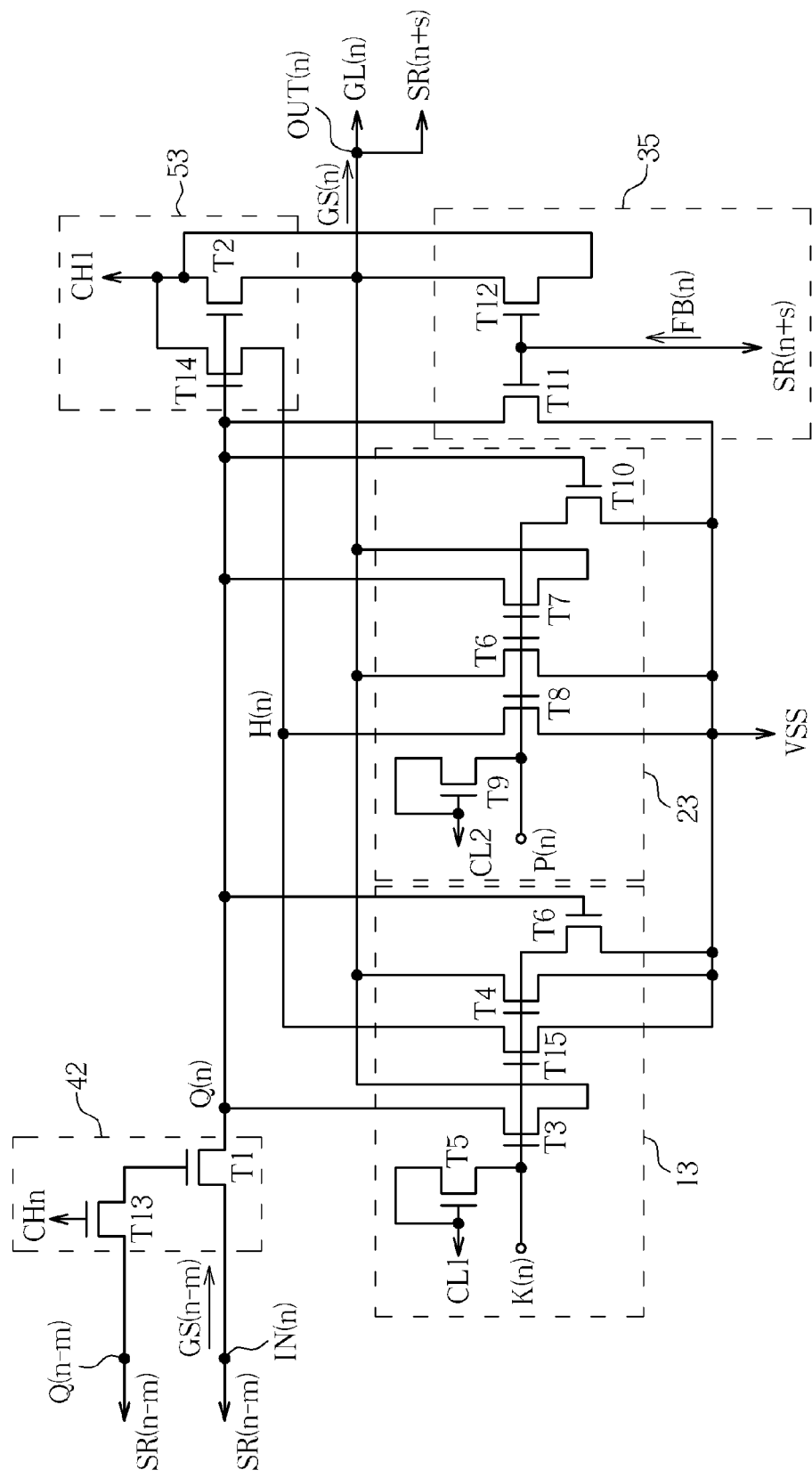
FIG. 15 is a diagram of an nth stage shift register unit according to an eighth embodiment of the present invention.

Referring to FIG. 15, which depicts a diagram of the nth stage shift register unit SR(n) according to an eighth embodiment of the present invention. In the eighth embodiment of the present invention, the shift register unit SR(n) includes an input end IN(n), an output end OUT(n), a first pull-down circuit 13, a second pull-down circuit 23, a fast pull-down circuit 35, a pull-up driving circuit 41 and a pull-up circuit 53. Having similar structure as the fourth embodiment, the eighth embodiment of the present invention further includes the fast pull-down circuit 35. The fast pull-down circuit in the eighth embodiment of the present invention includes transistor switches T11 and T12. The transistor switch T11 includes a gate coupled to the output end OUT(n+s) of the shift register unit SR(n+s) for receiving the feedback signal FB(n), a drain coupled to the node Q(n), and a source coupled to the voltage source VSS. The transistor switch T12 includes a gate coupled to the gate of the transistor switch T11, a drain coupled to the drain of the transistor switch T2, and a source coupled to the source of the transistor switch T2. The operation of the LCD device 300 according to the eighth embodiment of the present invention will be explained in detail in the following paragraphs.

Figure 16:
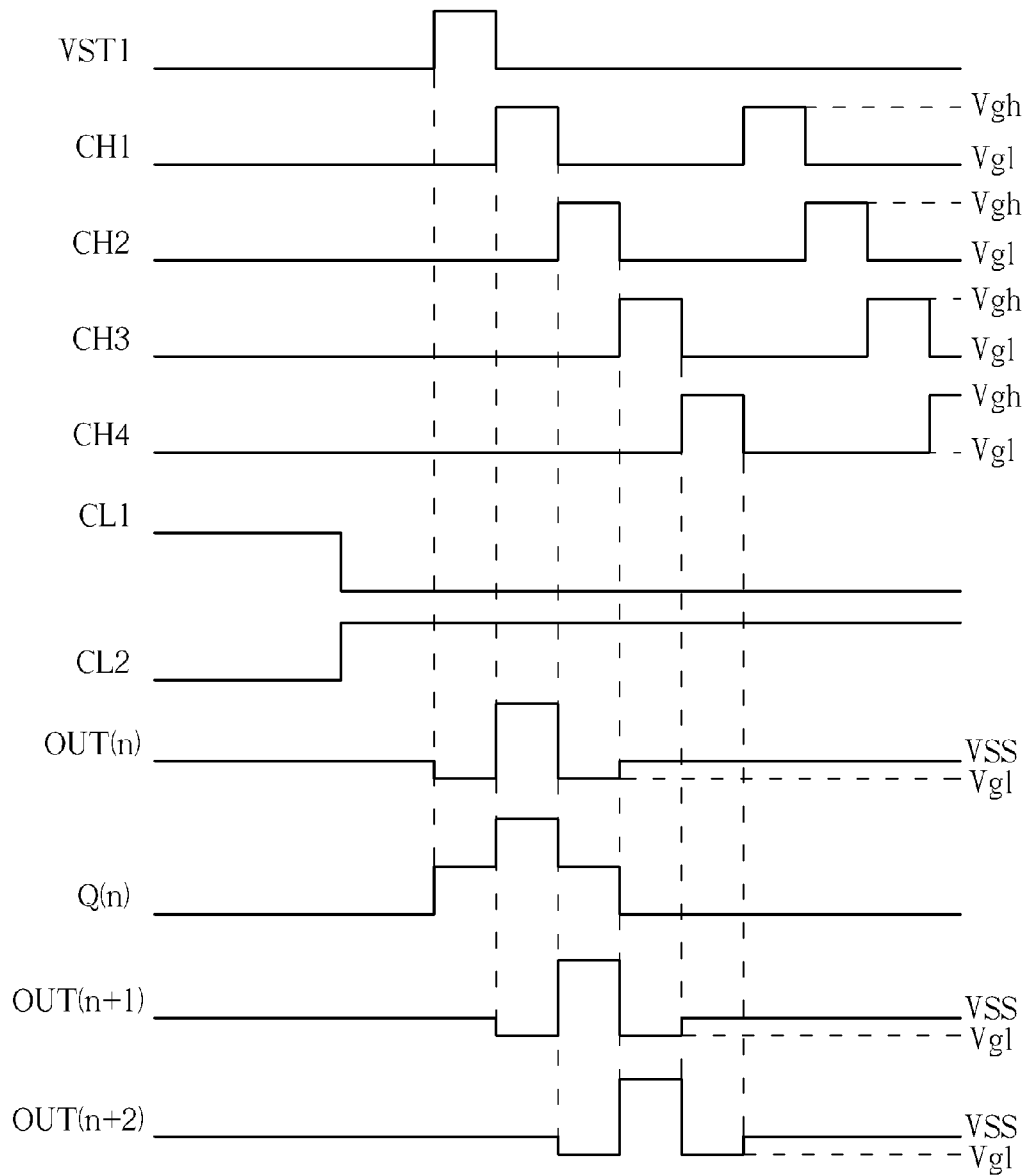
FIGS. 16-18 are timing diagrams illustrating the operation of the shift register according to the fifth through eighth embodiments of the present invention.

Referring to FIG. 16, which depicts a timing diagram illustrating the operation of the shift register 300 according to the fifth through eighth embodiments of the present invention when m=1 and s=1. In the embodiment illustrated in FIG. 16, the low-frequency clock signals CL1, CL2, the high-frequency clock signals CH1-CH4, and the start pulse signal VST1 are used for driving the shift register 210. The pulse width of the high-frequency clock signals CH1-CH4 is equal to that of the start pulse signal VST1, but the high-frequency clock signals CH1-CH4 differ in phase. Each clock signal switches between a high voltage level Vgh and a low voltage level Vgl based on a predetermined frequency, wherein the frequency of the low-frequency clock signals CL1 and CL2 is much lower than that of the high-frequency clock signals CH1-CH4 (for example, the pulse width of the low-frequency clock signals CL1 and CL2 can be around 100 times as large as that of the start pulse signal VST1 or VST2, or the low-frequency clock signals CL1 and CL2 can switch phases every 100 frames when the high-frequency clock signals CH1-CH4 switch phases after each frame), and the low-frequency clock signals CL1 and CL2 have opposite phases at the same time. In the fifth through eighth embodiments of the present invention, the LCD device 300 generates the nth stage gate driving signal GS(n) according to the (n−1)th stage gate driving signal GS(n−1), while compensates the feed-through effect according to the (n+1)th stage gate driving signal GS(n+1). During the driving period of the (n+1)th stage shift register unit SR(n+1), the fast pull-down circuit 35 pulls down the gate driving signal GS(n) to the low voltage level Vgl using the transistor switch T12. The charge coupling caused by the driving period of the shift register unit SR(n−1) and influencing the data voltages of the pixels can thus be compensated.

Figure 17:
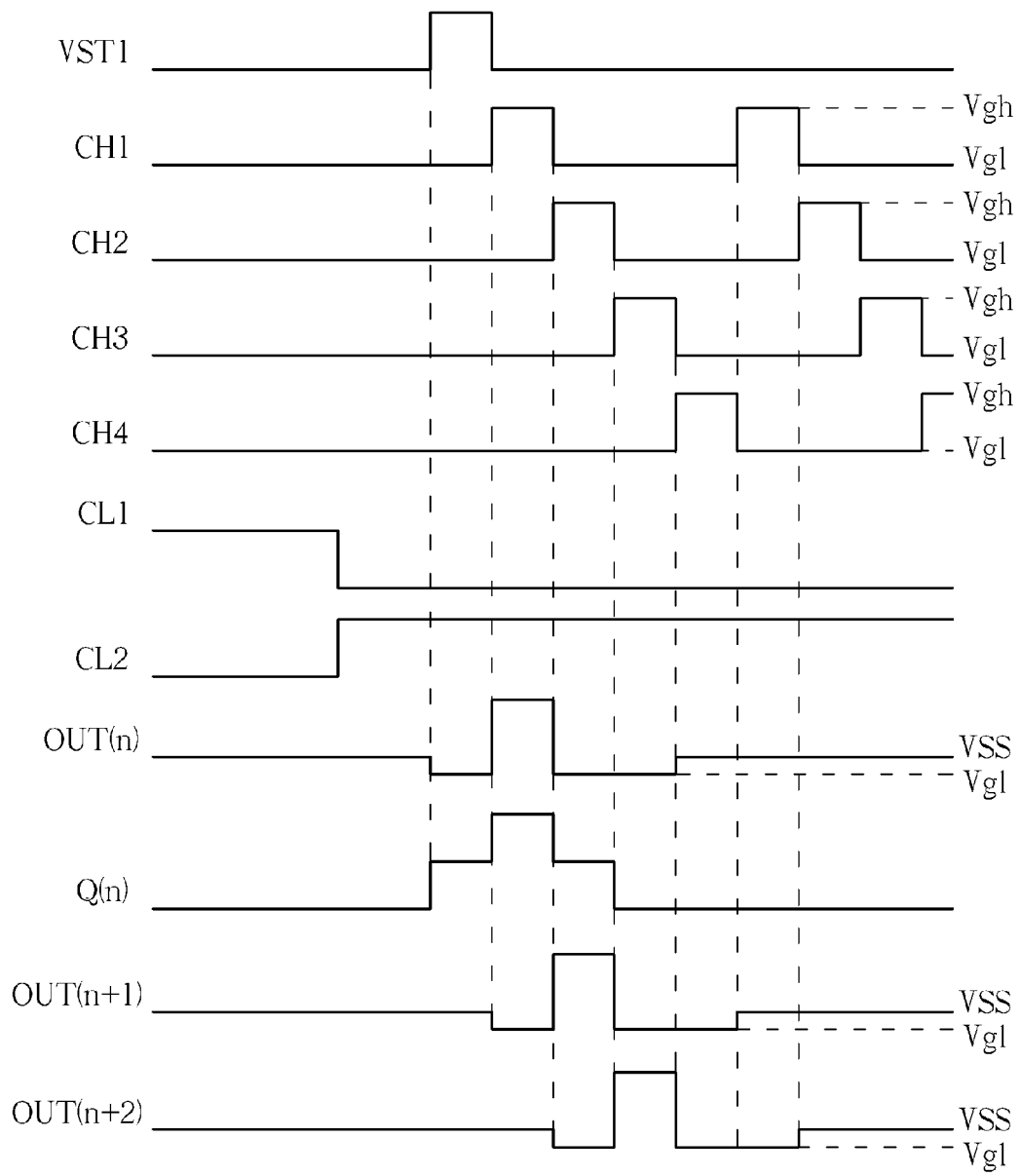

Referring to FIG. 17, which depicts a timing diagram illustrating the operation of the shift register 300 according to the fifth through eighth embodiments of the present invention when m=1 and s=2. In the embodiment illustrated in FIG. 17, the LCD device 300 generates the nth stage gate driving signal GS(n) according to the (n−1)th stage gate driving signal GS(n−1), while compensates the feed-through effect according to the (n+2)th stage gate driving signal GS(n+2). During the driving period of the (n+2)th stage shift register unit SR(n+2), the fast pull-down circuit 35 pulls down the gate driving signal GS(n) to the low voltage level Vgl using the transistor switch T12. The charge coupling caused by the driving period of the shift register unit SR(n−1) and influencing the data voltages of the pixels can thus be compensated.

Figure 18:
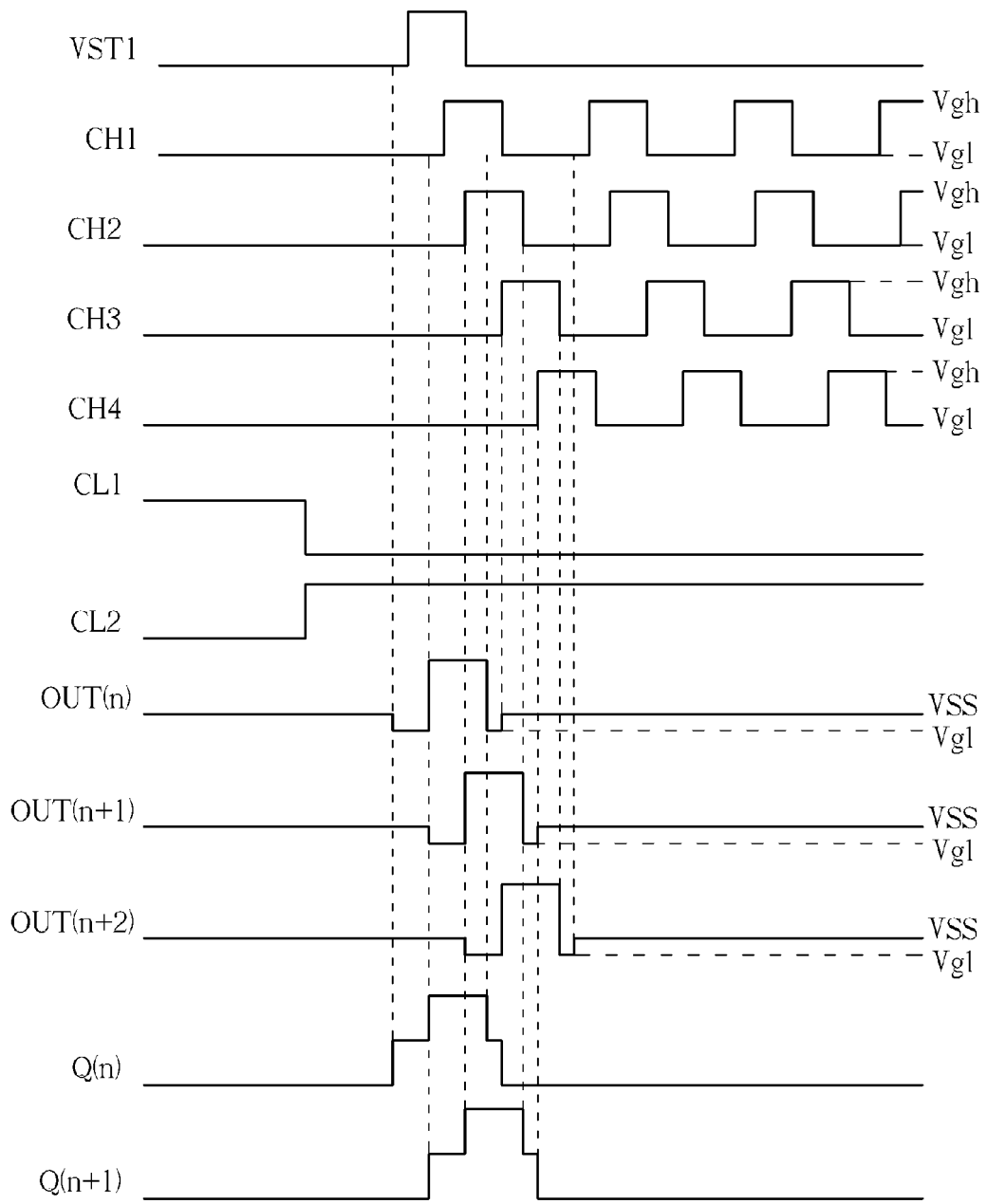

Referring to FIG. 18, which depicts a timing diagram illustrating the operation of the shift register 300 according to the fifth through eighth embodiments of the present invention when m=2 and s=2. In the embodiment illustrated in FIG. 18, the LCD device 300 generates the nth stage gate driving signal GS(n) according to the (n−2)th stage gate driving signal GS(n−2), while compensates the feed-through effect according to the (n+2)th stage gate driving signal GS(n+2). During the driving period of the (n+2)th stage shift register unit SR(n+2), the fast pull-down circuit 35 pulls down the gate driving signal GS(n) to the low voltage level Vgl using the transistor switch T12. The charge coupling caused by the driving period of the shift register unit SR(n−2) and influencing the data voltages of the pixels can thus be compensated.

In the above-mentioned embodiments, the transistor switches T1-T14 can include thin film transistor (TFT) switches, or other devices having similar function. The values of m and n are merely used to explain how the feed-through effect can be compensated, but do not limit the scope of the present invention.

The present invention increases the lifetime and accuracy of the transistor switches by driving the shift register with a plurality of high-frequency clock signals and two low-frequency clock signals, thereby providing GOA driving circuits with low power-consumption and high reliability. Meanwhile, the transistor switch T12 in the fast pull-down circuit 35 can pull down the gate driving signal GS(n) to the low voltage level Vgl during the driving period of the shift register unit SR(n+s), thereby compensating the charge coupling on the data voltages of the pixels caused by the driving period of the shift register unit SR(n−m).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register comprising a plurality of serially-coupled shift register units, an Nth stage shift register unit among the plurality of shift register units comprising:
   an input end for receiving an input voltage;
   an output end for outputting an output voltage;
   a first node;
   a pull-up driving circuit for transmitting the input voltage to the first node;
   a pull-up circuit for providing the output voltage according to a first clock signal and the input voltage;
   a second node;
   a buffer circuit for providing a start pulse signal at the second node according to the first clock signal and the input voltage;
   a first pull-down circuit for providing a first voltage at the first node or at the output end according to a second clock signal, comprising:
      a first switch including:
         a first end coupled to the first node;
         a second end coupled to the output end; and
         a control end;
      a second switch including:
         a first end coupled to the output end;
         a second end for receiving the first voltage; and
         a control end coupled to the control end of the first switch;
      a third switch including:
         a first end coupled to the control end of the first switch;
         a second end for receiving the first voltage; and
         a control end coupled to the first node;
      a fourth switch including:
         a first end for receiving the second clock signal;
         a second end coupled to the control end of the first switch; and
         a control end coupled to the first end of the fourth switch; and
      a fifth switch including:
         a first end coupled to the second node;
         a second end for receiving the first voltage; and
         a control end coupled to the control end of the first switch;
   a second pull-down circuit for providing a second voltage at the first node or at the output end according to a third clock signal, comprising:
      a sixth switch including:
         a first end coupled to the first node;
         a second end coupled to the output end; and
         a control end;
      a seventh switch including:
         a first end coupled to the output end;
         a second end for receiving the second voltage; and
         a control end coupled to the control end of the sixth switch;
      an eighth switch including:
         a first end coupled to the control end of the sixth switch;
         a second end for receiving the second voltage; and
         a control end coupled to the first node;
      a ninth switch including:
         a first end for receiving the third clock signal;
         a second end coupled to the control end of the sixth switch; and
         a control end coupled to the first end of the ninth switch; wherein a frequency of the first clock signal is higher than a frequency of the second or the third clock signal; and
      a tenth switch including:
         a first end coupled to the second node;
         a second end for receiving the second voltage; and
         a control end coupled to the control end of the sixth switch; and
   a third pull-down circuit for providing a third voltage at the first node or at the output end according to a feedback voltage.

2. The shift register of claim 1, wherein the pull-up driving circuit comprises:
   a fourteenth switch including:
      a first end for receiving the input voltage;
      a second end coupled to the first node; and
      a control end; and
   a fifteenth switch including:
      a first end coupled to a prior stage shift register unit;
      a second end coupled to the control end of the fourteenth switch; and
      a control end for receiving a fourth clock signal, wherein a frequency of the fourth clock signal is higher than the frequency of the second or the third clock signal.

3. The shift register of claim 1, wherein the buffer circuit comprises:
   a sixteenth switch including:
      a first end for receiving the first clock signal;
      a second end coupled to the second node; and
      a control end coupled to the first node.

4. The shift register of claim 1, wherein the input voltage is a start pulse signal generated by another shift register unit among the plurality of shift register units.

5. The shift register of claim 1, wherein the third pull-down circuit comprises:
    an eleventh switch including:
        a first end coupled to the first node;
        a second end for receiving the third voltage; and
        a control end for receiving the feedback voltage; and
    a twelfth switch including:
        a first end coupled to the output end;
        a second end for receiving the first clock signal; and
        a control end coupled to the control end of the eleventh switch.

\* \* \* \* \*